United States Patent
Noguchi

(10) Patent No.: US 6,890,846 B2
(45) Date of Patent: May 10, 2005

(54) METHOD FOR MANUFACTURING SEMICONDUCTOR INTEGRATED CIRCUIT DEVICE

(75) Inventor: Junji Noguchi, Hamura (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/293,442

(22) Filed: Nov. 14, 2002

(65) Prior Publication Data

US 2003/0114000 A1 Jun. 19, 2003

(30) Foreign Application Priority Data

Dec. 18, 2001 (JP) ........................................ 2001-384535

(51) Int. Cl.[7] .......................................... H01L 21/4763
(52) U.S. Cl. ..................... 438/622; 438/637; 438/640; 438/658; 438/660; 438/663; 438/666; 438/669; 438/672; 438/673; 438/687; 438/701; 438/720; 438/742
(58) Field of Search ............................... 438/622, 637, 438/640, 658, 660, 663, 666, 669, 672–673, 687, 701, 720, 742

(56) References Cited

U.S. PATENT DOCUMENTS

| | | | | |
|---|---|---|---|---|
| 5,350,488 A | * | 9/1994 | Webb | 216/67 |
| 6,287,954 B1 | * | 9/2001 | Ashley et al. | 438/622 |
| 6,309,970 B1 | * | 10/2001 | Ito et al. | 438/687 |
| 6,794,304 B1 | * | 9/2004 | Gu et al. | 438/740 |
| 2001/0034125 A1 | * | 10/2001 | Uozumi | 438/678 |
| 2003/0001271 A1 | * | 1/2003 | Uozumi | 257/758 |

FOREIGN PATENT DOCUMENTS

| | | |
|---|---|---|
| JP | 10-50632 | 2/1998 |
| JP | 10-189602 | 7/1998 |
| JP | 11-111843 | 4/1999 |
| JP | 2000-277612 | 10/2000 |
| JP | 2000-323479 | 11/2000 |

* cited by examiner

Primary Examiner—Lynne A. Gurley
(74) Attorney, Agent, or Firm—Miles & Stockbridge P.C.

(57) ABSTRACT

Provided is a manufacturing method of a semiconductor device which comprises (a) depositing a first insulating film over a wafer, (b) forming an interconnect opening in the first insulating film, (c) forming, in the interconnect opening, an interconnect having a conductor film comprised mainly of copper, (d) forming a taper at a corner of said conductor film on the opening side of the interconnect opening, and (e) depositing a second insulating film over the first insulating film and interconnect. The present invention makes it possible to improve dielectric breakdown strength between interconnects each having a main conductor film comprised mainly of copper.

40 Claims, 16 Drawing Sheets

METHOD FOR MANUFACTURING SEMICONDUCTOR INTEGRATED CIRCUIT DEVICE

BACKGROUND OF THE INVENTION

The present invention relates to a method for manufacturing a semiconductor device and a semiconductor device technique, particularly to a technique effective when adapted to a method for manufacturing a semiconductor device having an inlaid interconnect containing a main conductor film comprised mainly of copper and such a semiconductor device.

An inlaid interconnect structure is formed by embedding a wiring material in an interconnect opening such as interconnect trench or hole formed in an insulating film in accordance with a metallization technique called "damascene technique" (single damascene and dual damascene techniques). When copper is employed as a main wiring material, however, it easily diffuses in an insulating film compared with a metal such as aluminum. Diffusion of copper from an inlaid interconnect to an insulating film is therefore suppressed or prevented by covering the surfaces (bottom surface and side surfaces) of the inlaid interconnect made of copper with a thin barrier metal film so as to avoid direct contact of the inlaid interconnect with the insulating film. Alternatively, diffusion of copper from the upper surface of the inlaid interconnect to the insulating film is suppressed or prevented by forming an interconnect capping insulating film made of, for example, silicon nitride film over the upper surface of the insulating film having an interconnect opening formed therein and covering therewith the upper surface of the inlaid interconnect.

A damascene metallization technique is described, for example, in Japanese Patent Laid-Open No. 2000-323479 in which in an inlaid interconnect structure, a copper interconnect and an insulating film are formed to have different surface height. In Japanese Patent Laid-Open No. 111843/1999, disclosed is an inlaid interconnect structure obtained by forming, in an inlaid interconnect, a copper layer to have an upper surface level lower than that of an insulating film and then embedding a barrier insulating film in the resulting indented portion. In Japanese Patent Laid-Open No. 50632/1998, disclosed is an inlaid interconnect structure by lowering the upper surface level of each of the copper layer and barrier metal of the inlaid interconnect relative to that of the insulating film and embedding a barrier insulating film in the indented portion. In Japanese Patent Laid-Open No. 2000-277612, disclosed is a technique of preventing remaining of a slurry after CMP (chemical mechanical polishing) by forming the upper surface level of each of the barrier metal and metal film of an inlaid interconnect higher than that of the insulating film. In Japanese Patent Laid-Open No. 189602/1998, disclosed is a technique of forming the upper surface level of a tungsten plug a little higher than that of an insulating film and rounding an inlaid plug.

SUMMARY OF THE INVENTION

As a result of investigation, the present inventors have found that the above-described inlaid interconnect forming technique using copper as a main conductor layer has the following problems. Described specifically, when copper is employed as a wiring material, the TDDB (Time Dependence on Dielectric Breakdown) lifetime is markedly shorter than that of another metal material (such as aluminum or tungsten). In addition, as interconnect pitches have become more minute, the effective electric field strength tends to increase. In recent years, an insulating material having a lower dielectric constant than that of silicon oxide tends to be used as an interlayer insulating film from the viewpoint of decreasing an interconnect capacitance. The insulating film having a low dielectric constant usually has a low dielectric breakdown, so that use of it has made it more difficult to maintain a long TDDB lifetime.

An object of the present invention to provide a technique capable of improving dielectric breakdown strength between interconnects each using copper as a main conductor film.

The above-described and the other objects and novel features of the present invention will be apparent from the description herein and accompanying drawings.

The outline of the typical inventions, of the inventions disclosed by the present application, will next be described briefly.

In the present invention, a main conductor film constituting an interconnect is formed of copper and it is kept apart, at a portion on which concentration of an electric field occurs, from the polished surface of the surrounding insulating film.

In the present invention, a main conductor film constituting an interconnect is formed of copper and it is rounded at a portion on which concentration of an electric field occurs.

The inventions provided by the present application include the followings:

(1) A method for manufacturing a semiconductor device which comprises the steps of:

(a) depositing a first insulating film on a wafer, (b) forming an interconnect opening in the first insulating film, (c) forming, in the interconnect opening, an interconnect having a conductor film comprised mainly of copper, (d) forming a taper at a corner of the conductor film on the opening side of the interconnect opening, and (e) depositing a second insulating film over the first insulating film and the interconnect.

(1-1) A method as described above in (1), wherein the taper is a round taper formed by heat treating the wafer in an atmosphere of a nitrogen gas, an ammonia gas or a nitrogen-ammonia gas mixture, or in a plasma atmosphere using the gas.

(1-2) A method as described above in (1), further comprising, between the steps (c) and (e), subjecting the first insulating film and the interconnect to reducing plasma treatment.

(1-3) A method as described above in (1-2), wherein the reducing plasma treatment is ammonia plasma treatment, hydrogen plasma treatment, or treatment using thereof in combination.

(1-4) A method as described above in (1), wherein the step (a) having the sub-steps of:

(a1) depositing a relatively thick insulating film, and (a2) after the sub-step (a1), depositing thereover a relatively thin insulating film having a higher dielectric constant than that of the relatively thick insulating film.

(1-5) A method as described above in (1-4), wherein a dielectric constant of the relatively thick insulating film is lower than that of a silicon dioxide film.

(1-6) A method as described above in (1-4), wherein the relatively thin insulating film is made of silicon carbide, silicon carbonitride or silicon oxynitride.

(1-7) A method as described above in (1), wherein the first insulating film is a single-substance insulating film having a dielectric constant lower than that of a silicon dioxide film.

(1-8) A method as described above in (1), wherein the second insulating film is made of silicon carbide, silicon carbonitride or silicon oxynitride.

(2) A method for manufacturing a semiconductor device, which comprises the following steps of:

(a) depositing a first insulating film over a wafer, (b) forming an interconnect opening in the first insulating film, (c) forming, in the interconnect opening, an interconnect having a first conductor film having barrier properties against copper diffusion and a second conductor film comprised mainly of copper, (d) forming a taper at a corner of the second conductor film on the opening side of the interconnect opening, and (e) depositing a second insulating film over the first insulating film and interconnect.

(2-1) A method as described above in (2), wherein the taper is a round taper formed by heat treating the wafer in an atmosphere of a nitrogen gas, an ammonia gas or a nitrogen-ammonia gas mixture, or in a plasma atmosphere using the gas.

(2-2) A method as described above in (2), further comprising, between the steps (c) and (e), subjecting the first insulating film and the interconnect to reducing plasma treatment.

(2-3) A method as described above in (2-2), wherein the reducing plasma treatment is ammonia plasma treatment, hydrogen plasma treatment, or treatment using both thereof in combination.

(2-4) A method as described above in (2), wherein the step (a) having the following sub-steps of:

(a1) depositing a relatively thick insulating film, and (a2) after the sub-step (a1), depositing thereover a relatively thin insulating film having a dielectric constant higher than that of the relatively thick insulating film.

(2-5) A method as described above in (2-4), wherein the relatively thick insulating film has a dielectric constant lower than that of a silicon dioxide film.

(2-6) A method as described above in (2-4), wherein the relatively thin insulating film is made of silicon carbide, silicon carbonitride or silicon oxynitride.

(2-7) A method as described above in (2), wherein the first insulating film is a single-substance insulating film having a dielectric constant lower than that of a silicon dioxide film.

(2-8) A method as described above in (2-7), wherein the step (c) comprises the following sub-steps of:

(c1) depositing the first conductor film over the first insulating film and in the interconnect opening, (c2) depositing the second conductor film over the first conductor film, (c3) selectively polishing the second conductor film to leave the first and second conductor films in the interconnect opening, and (c4) selectively polishing the first conductor film to leave the first and second conductor films in the interconnect opening, thereby forming the interconnect.

(2-9) A method as described above in (2-8), wherein the amount of an abrasive used in the polishing step of (c3) is 0 or smaller than that used in the polishing step (c4).

(2-10) A method as described above in (2), wherein the second insulating film is made of silicon carbide, silicon carbonitride or silicon oxynitride.

(2-11) A method as described above in (2), wherein the second insulating film is a laminate film obtained by depositing a third insulating film over the first insulating film and the interconnect to protect the first conductor film from oxidation, and then depositing a fourth insulating film over the third insulating film by chemical vapor deposition using an oxygen-containing gas.

(2-12) A method as described above in (2-11), wherein the third insulating film is made of silicon nitride.

(2-13) A method as described above in (2-11), wherein the third insulating film is made of silicon carbide or silicon carbonitride.

(2-14) A method as described above in (2-11), wherein the fourth insulating film is made of silicon oxynitride by chemical vapor deposition using a gas mixture containing trimethoxysilane and nitrogen oxide.

(2-15) A method as described above in (2-11), wherein the third insulating film is thinner than the fourth insulating film.

(3) A method for manufacturing a semiconductor device, which comprises, in the metallization of each of a plurality of interconnect layers formed over a wafer:

(a) depositing a first insulating film over a wafer, (b) forming an interconnect opening in the first insulating film, (c) forming, in the interconnect opening, an interconnect having a first conductor film having barrier properties against copper diffusion and a second conductor film comprised mainly of copper, and (d) depositing a second insulating film over the first insulating film and the interconnect, wherein:

in the metallization step of the interconnect layers relatively near the main surface of the wafer among the plurality of interconnect layers, the method further comprises, between the steps (c) and (d), a step of forming a taper at a corner of the second conductor film on the opening side of the interconnect opening, and in the metallization step of the interconnect layers relatively far from the main surface of the wafer among the plurality of interconnect layers, the second insulating film is deposited without forming the taper.

(4) A method for manufacturing a semiconductor device, which comprises, in the metallization of at least two of a plurality of interconnect layers formed over a wafer:

(a) depositing a first insulating film over a wafer, (b) forming an interconnect opening in the first insulating film, (c) forming, in the interconnect opening, an interconnect having a first conductor film having barrier properties against copper diffusion and a second conductor film comprised mainly of copper, (d) forming a taper at a corner of the second conductor film on the opening side of the interconnect opening, and (e) depositing a second insulating film over the first insulating film and the interconnect, wherein:

the taper of the second conductor film in the interconnect of the interconnect layer relatively near the main surface of the wafer, among the plurality of interconnect layers, is formed greater than that of the second conductor film in the interconnect of the interconnect layer relatively far from the main surface of the wafer among the plurality of interconnect layers.

(5) A method for manufacturing a semiconductor device, which comprises, in the metallization of each of a plurality of interconnect layers formed over a wafer:

(a) depositing a first insulating film over a wafer, (b) forming an interconnect opening in the first insulating film, (c) forming, in the interconnect opening, an interconnect having a first conductor film having barrier properties against copper diffusion and a second conductor film comprised mainly of copper, and (d) depositing a second insulating film over the first insulating film and the interconnect, wherein:

in the metallization formation step of the interconnect layer relatively near the main surface of the wafer among the plurality of interconnect layers, the method further has, between the steps (c) and (d), a step of forming a step difference between a first surface of the second conductor film on a side on which the second insulating film is deposited and a second surface of the first insulating film on a side on which the second insulating film is to be deposited, and in the metallization step of the interconnect layer relatively far from the main surface of the wafer among the plurality of interconnect layers, the second insulating film is deposited without forming the step difference.

(6) A method for manufacturing a semiconductor device, which comprises, in the metallization of at least two of a plurality of interconnect layers formed over a wafer:

(a) depositing a first insulating film over a wafer, (b) forming an interconnect opening in the first insulating film, (c) forming, in the interconnect opening, an interconnect having a first conductor film having barrier properties against copper diffusion and a second conductor film comprised mainly of copper, and (d) forming a step difference between a first surface of the second conductor film on a side on which a second insulating film is to be deposited and a second surface of the first insulating film on a side on which the second insulating film is to be deposited, and (e) depositing the second insulating film over the first insulating film and interconnect, wherein:

the step difference of the second conductor film in the interconnect of the interconnect layer relatively near the main surface of the wafer among the plurality of interconnect layers is formed greater than that of second conductor film in the interconnect of the interconnect layer relatively far from the main surface of the wafer.

(6-1) A method as described above in (6), wherein:

the step (d) is a step for selectively etching a surface layer of the first surface of the second conductor film to indent the first surface of the second conductor film relative to the second surface of the first insulating film in a direction of the main surface of the wafer.

(7) A method for manufacturing a semiconductor device, which comprises, in the metallization of each of a plurality of interconnect layers formed over a wafer:

(a) depositing a first insulating film over a wafer, (b) forming an interconnect opening in the first insulating film, (c) forming, in the interconnect opening, an interconnect having a first conductor film having barrier properties against copper diffusion and a second conductor film comprised mainly of copper, and (d) depositing a second insulating film over the first insulating film and the interconnect, wherein:

in the metallization step of the interconnect layer relatively near the main surface of the wafer among the plurality of interconnect layers, the method further has, between the steps (c) and (d), a step of forming a step difference between a first surface of the first and second conductor films on a side on which the second insulating film is to be deposited and a second surface of the first insulating film on a side on which the second insulating film is to be deposited, and in the metallization step of the interconnect layer relatively far from the main surface of the wafer among the plurality of interconnect layers, the second insulating film is deposited without forming the step difference.

(8) A method for manufacturing a semiconductor device, which comprises, in the metallization step of at least two of a plurality of interconnect layers formed over a wafer:

(a) depositing a first insulating film over a wafer, (b) forming an interconnect opening in the first insulating film, (c) forming, in the interconnect opening, an interconnect having a first conductor film having barrier properties against copper diffusion and a second conductor film comprised mainly of copper, (d) forming a step difference between a first surface of the first and second conductor films on a side on which a second insulating film is to be deposited and a second surface of the first insulating film on a side on which the second insulating film is to be deposited, and (e) depositing the second insulating film over the first insulating film and the interconnect, wherein:

the step difference in the interconnect of the interconnect layer relatively near the main surface of the wafer, among the plurality of interconnect layers, is formed greater than that in the interconnect of the interconnect layer relatively far from the main surface of the wafer among the plurality of interconnect layers.

(8-1) A method as described above in (8), wherein:

the step (c) is a step of selectively etching a surface layer from the first surface of the first and second conductor films to indent the first surface of the first and second conductor films relative to the polished surface of the first insulating film in a direction of the main surface of the wafer.

(8-2) A method as described above in (8), wherein:

the step (d) is a step of selectively etching the second surface of the first insulating film so that the first surface of the first and second conductor films protrude relative to the second surface of the first insulating film in a direction far from the main surface of the wafer.

(9) A semiconductor device comprising:

(a) an interconnect opening formed in a first insulating film, (b) an interconnect formed by embedding the interconnect opening with a conductor film comprised mainly of copper and having a taper at a corner of the conductor film on the opening side of the interconnect opening, and (c) a second insulating film deposited over the first insulating film and the interconnect.

(10) A semiconductor device comprising:

(a) an interconnect opening formed in a first insulating film, (b) an interconnect formed by embedding the interconnect opening with a first conductor film having barrier properties against copper diffusion and a second conductor film comprised mainly of copper, and having a taper at a corner of the second conductor film on the opening side of the interconnect opening, and (c) a second insulating film deposited over the first insulating film and the interconnect.

(11) A semiconductor device having a plurality of interconnect layers formed over a semiconductor substrate, at least two of the plurality of interconnect layers comprising:

(a) an interconnect opening formed in a first insulating film, (b) an interconnect formed by embedding the interconnect opening with a first conductor film having barrier properties against copper diffusion and a second conductor film comprised mainly of copper, and (c) a second insulating film deposited over the first insulating film and the interconnect, wherein:

in the interconnect layer relatively near the main surface of the semiconductor substrate, among the plurality of interconnect layers, an interconnect equipped with a taper at a corner of the second conductor film on the opening side of the interconnect opening is formed; and in the interconnect layer relatively far from the main surface of the semiconductor substrate, among the plurality of interconnect layers, the taper is not formed on the second conductor film and an interconnect is formed so that the first surface level of the second conductor film on a side on which the second insulating film is to be deposited is formed substantially equal to the second surface level of the first insulating film on a side on which the second insulating film is to be deposited.

(12) A semiconductor device having a plurality of interconnect layers formed over a semiconductor substrate, at least two of the plurality of interconnect layers comprising:

(a) an interconnect opening formed in a first insulating film, (b) an interconnect formed by embedding the interconnect opening with a first conductor film having barrier properties against copper diffusion and a second conductor film comprised mainly of copper, and having a taper at a corner of the second conductor film on the opening side of the interconnect opening, and (c) a second insulating film deposited over the first insulating film and the interconnect, wherein:

the taper of the second conductor film in the interconnect of the interconnect layer relatively near the main surface of the wafer among the plurality of interconnect layers is greater than that of the second conductor film in the interconnect of the interconnect layer relatively far from the main surface of the wafer among the plurality of interconnect layers.

(13) A semiconductor device having a plurality of interconnect layers formed over a semiconductor substrate, at least two of the plurality of interconnect layers comprising:

(a) an interconnect opening formed in a first insulating film, (b) an interconnect formed by embedding the interconnect opening with a first conductor film having barrier properties against copper diffusion and a second conductor film comprised mainly of copper, and (c) a second insulating film deposited over the first insulating film and the interconnect, wherein:

in the interconnect of the interconnect layer relatively near the main surface of the semiconductor substrate among the plurality of interconnect layers, a step difference is formed between the first surface of the second conductor film on a side on which the second insulating film is to be deposited and the second surface of the first conductor film and the first insulating film on a side on which the second insulating film is to be deposited;

in the interconnect of the interconnect layer relatively far from the main surface of the semiconductor substrate among the plurality of interconnect layers, the first surface level of the second conductor film is formed substantially equal to the second surface level of the first conductor film and first insulating film.

(14) A semiconductor device having a plurality of interconnect layers formed over a semiconductor substrate, at least two of the plurality of interconnect layers comprising:

(a) an interconnect opening formed in a first insulating film, (b) an interconnect formed by embedding the interconnect opening with a first conductor film having barrier properties against copper diffusion and a second conductor film comprised mainly of copper, and having a step difference between a first surface of the second conductor film on a side on which a second insulating film is to be deposited and a second surface of the first conductor film and the first insulating film on a side on which the second insulating film is to be deposited, and (c) the second insulating film deposited over the first insulating film and the interconnect, wherein:

the step difference in the interconnect of the interconnect layer relatively near the main surface of the semiconductor substrate among the plurality of interconnect layers is greater than that in the interconnect of the interconnect layer relatively far from the main surface of the semiconductor substrate among the plurality of interconnect layers.

(14-1) A semiconductor device as described above in (14), wherein the step difference is formed by indenting the first surface of the second conductor film relative to the second surface of the first conductor film and the first insulating film in a direction of the main surface of the semiconductor substrate.

(15) A semiconductor device having a plurality of interconnect layers formed over a semiconductor substrate, at least two of the plurality of interconnect layers comprising:

(a) an interconnect opening formed in a first insulating film, (b) an interconnect formed by embedding the interconnect opening with a first conductor film having barrier properties against copper diffusion and a second conductor film comprised mainly of copper, and (c) a second insulating film deposited over the first insulating film and the interconnect, wherein:

in the interconnect of the interconnect layer relatively near the main surface of the semiconductor substrate among the plurality of interconnect layers, a step difference is disposed between a first surface of the first and second conductor films on a side on which the second insulating film is to be deposited and a second surface of the first insulating film on a side on which the second insulating film is to be deposited, and in the interconnect of the interconnect layer relatively far from the main surface of the semiconductor substrate among the plurality of interconnect layers, a first surface level of the first and second conductor films is formed to be substantially equal to a second surface level of the first insulating film.

(16) A semiconductor device having a plurality of interconnect layers formed over a semiconductor substrate, at least two of the plurality of interconnect layers comprising:

(a) an interconnect opening formed in a first insulating film, (b) an interconnect formed by embedding the interconnect opening with a first conductor film having barrier properties against copper diffusion and a second conductor film comprised mainly of copper, and having a step difference between a first surface of the first and second conductor films on a side on which a second insulating film is to be deposited and a second surface of the first insulating film on a side on which the second insulating film is to be deposited, and (c) the second insulating film deposited over the first insulating film and the interconnect, wherein:

the step difference in the interconnect of the interconnect layer relatively near the main surface of the semiconductor substrate among the plurality of interconnect layers is greater than that in the interconnect of the interconnect layer relatively far from the main surface of the semiconductor substrate among the plurality of interconnect layers.

(16-1) A semiconductor as described above in (16), wherein the step difference is formed by indenting the first surface of the first and second conductor films relative to the second surface of the first insulating film in a direction of the main surface of the semiconductor substrate.

(16-2) A semiconductor device as described above in (16), wherein the step difference is formed by causing the first surface of the first and second conductor films to protrude relative to the second surface of the first insulating film in a direction far from the main surface of the semiconductor substrate.

DETAILED DESCRIPTION OF THE PREFERRED EMBODIMENTS

Prior to the detailed description of the invention of this application, the meaning of each of the terms used in this embodiment will next be described.

1. The "TDDB (Time Dependence on Dielectric Breakdown) life" as used herein is a measure for objectively measuring time dependency of dielectric breakdown and the term means time (lifetime) determined by applying a relatively high voltage between electrodes under measuring conditions of a predetermined temperature (ex. 140° C.), drawing a graph wherein time from application of voltage to dielectric breakdown is plotted against applied electric field, and extrapolating the practical electric field strength (ex. 0.2 MV/cm) in the graph.

Figure 1:
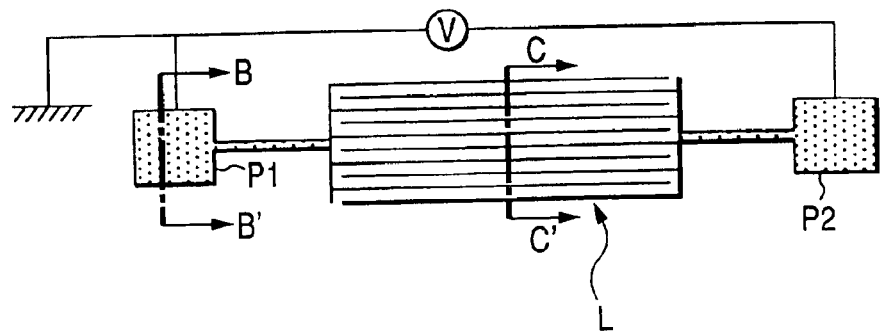
FIG. 1 is a plane view of a sample used for measuring a TDDB life of the embodiment of the present invention.
Figure 2:
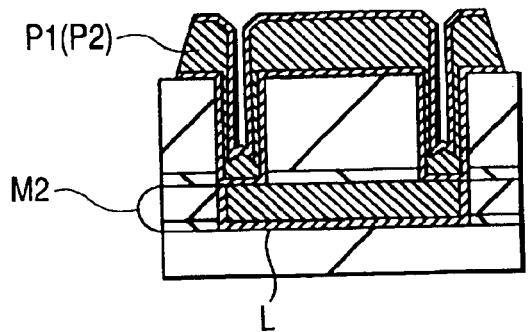
FIG. 2 is a cross-sectional view taken along a line B–B' of FIG. 1.
Figure 3:
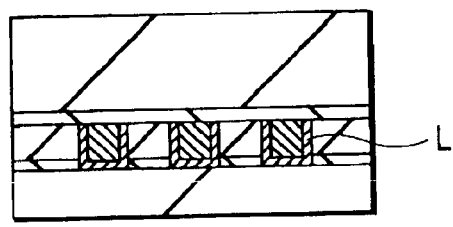
FIG. 3 is a cross-sectional view taken along a line C–C' of FIG. 1.

FIGS. 1 to 3 each illustrates a sample used in the present application for the measurement of the TDDB life, wherein FIG. 1 is a plane view, and FIGS. 2 and 3 are cross-sections taken along lines B–B' and C–C' of FIG. 1, respectively. This sample can be formed practically in a TEG (Test Equipment Group) region of a wafer. As illustrated, a pair of comb-like interconnects L are formed in a second-level interconnect M2 and are connected with pads P1, P2 of the uppermost layer, respectively. An electric current is measured by applying an electric field between these comb-like interconnects L. The pads 1, 2 are measuring terminals. The width of the comb-like interconnect L, distance between any two adjacent interconnects and its thickness are each 0.5 $\mu$m. The facing length of the interconnect is formed to $1.58\times10^5$ $\mu$m.

Figure 4:
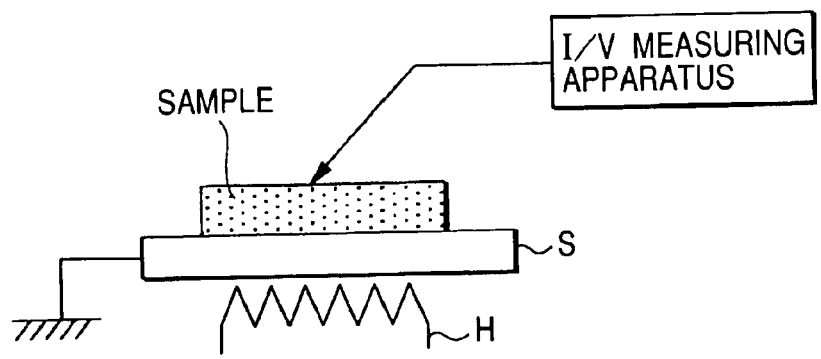
FIG. 4 is a schematic view illustrating the outline of the measurement when the sample of FIG. 1 is used.

FIG. 4 is a schematic view illustrating the outline of measurement. The sample is supported on a measuring stage S and a current-voltage measuring apparatus (I/V measuring apparatus) is connected between the pads P1 and P2. The sample stage S is heated by a heater H to adjust the temperature of the sample to 140° C. Although TDDB life is measured by either one of the constant voltage stress method and low current stress method, the former one wherein an average electric field applied to an insulating film shows a fixed value is employed in the present application. After application of voltage, the current density decreases with the passage of time and then, a drastic increase in the current (dielectric breakdown) is observed. Here, the time until the leak current density reaches 1 $\mu$A/cm$^2$ is designated as TDDB life (the TDDB life at 5 MV/cm). The term "TDDB" as used herein means the breakdown time (lifetime) at 0.2 MV/cm unless otherwise specifically referred to, but in a broader sense, it is sometimes used as a time until breakdown at a preliminarily designated electric field strength. Unless otherwise specifically described, the TDDB life means that at the sample temperature of 140° C. The TDDB life is measured using the above-described comb-like interconnects L, but it is needless to say that it reflects the breakdown lifetime between actual interconnects.

2. The term "plasma treatment" as used herein means treatment of exposing the surface of a substrate or, when a member such as insulating film or metal film is formed on the substrate, the surface of the member to the circumstance under plasma condition and giving chemical or mechanical (bombardment) action of the plasma to the surface. Plasma is usually formed by, while supplementing a specific gas (treatment gas) as needed in a reaction chamber purged with the gas, ionizing the gas by the action of high-frequency electric field or the like. In practice, however, it is impossible to completely purge the chamber with the treatment gas. In the below-described embodiment, therefore, the term "ammonia plasma" does not indicate complete ammonia plasma and existence of impurity gases (nitrogen, oxygen, carbon dioxide, water vapor and/or the like) contained in the plasma is permitted. It is needless to say that the plasma may contain another gas such as diluting gas or additive gas.

3. The term "plasma of reducing atmosphere (reducing plasma)" as used herein means the plasma circumstance wherein reactive radicals, ions, atoms or molecules having reducing action, that is, oxygen pulling action, predominantly exist. Radicals and ions contain atomic or molecular radicals and ions. In the plasma circumstance, not only single reactive one but also plural reactive ones may be contained. For example, a hydrogen radical and NH$_3$ radical may coexist in the circumstance.

4. The term "made of copper" as used herein means that copper is used as a main component. High-purity copper inevitably contains impurities so that a member made of copper is permitted to contain additives or impurities. This will equally apply to, not only copper, but also another metal (titanium nitride, or the like).

5. The term "chemical mechanical polishing (CMP)" usually means polishing of a surface to be polished by relatively moving a polishing pad, which is made of a relatively soft cloth-like sheet material, in a surface direction under the condition brought into contact with the polishing pad, while supplying a slurry. Embodiments of the present invention embrace, in addition, CML (Chemical Mechanical Lapping) wherein polishing is conducted by moving a surface to be polished relative to the surface of a hard abrasive, polishing using a fixed abrasive and abrasive free CMP which does not use an abrasive.

6. The term "abrasive-free chemical mechanical polishing" means chemical mechanical polishing using a slurry having a weight concentration of abrasive grains less than 0.5%, while the term "abrasive-using chemical mechanical polishing" means chemical mechanical polishing using a slurry having a weight concentration of abrasive grains exceeding 0.5%. They are however relative naming. In the case where abrasive-using chemical mechanical polishing is conducted both in the first and the second steps, the polishing in the first step is sometimes called abrasive-free chemical mechanical polishing if the polishing concentration of the first step is smaller by at least single digit, desirably at least double digits, than that of the second step. The term "abrasive-free chemical mechanical polishing" as used herein embraces, as well as abrasive-free chemical mechanical polishing conducted for the whole unit planarization process of a metal film to be polished, use, in combination, of abrasive-free chemical mechanical polishing for the main process and abrasive-using chemical mechanical polishing for a secondary process.

7. The term "polishing liquid (slurry)" usually means a suspension obtained by mixing abrasive grains in a chemical etchant, but in this application, it embraces a polishing liquid free of abrasive grains in consideration of the characteristics of the present invention.

8. The term "anticorrosive" means a chemical for preventing or suppressing the progress of polishing by CMP by forming an anticorrosive and/or hydrophobic protecting film on the metal surface and benzotriazole (BTA) is usually employed as the chemical (refer to Japanese Patent Application Laid-Open No. 64594/1996, for further details).

9. The term "scratch-free" as used herein means the state under which no defect exceeding a predetermined size is detected over the whole wafer surface to be polished by the above-described CMP or within a predetermined unit area. The "predetermined size" differs, depending on the generation or kind of a semiconductor device. In the embodiments of the present invention, however, it is determined that in an in-line comparison test on defects, defects of 0.3 $\mu$m or greater are not detected within a wafer polished surface of 200 mm in diameter.

10. The term "conductive barrier film" usually means a conductive film formed relatively thin on the side surfaces or bottom surface of an inlaid interconnect and having diffusion barrier properties, thereby preventing diffusion of copper into an interlayer insulating film or underlying layer. Refractory metals such as titanium (Ti) and tantalum (Ta), and refractory metal nitrides such as titanium nitride (TiN) and tantalum nitride (TaN) are usually employed for it.

11. The term "inlaid interconnect or inlaid metal interconnect" usually means an interconnect patterned by a metallization technique such as single damascene or dual damascene technique, more specifically, an interconnect formed by embedding a conductive film inside of an interconnect opening such as trench or hole in an insulating film and then removing unnecessary conductive films over the insulating film. Usually, the term "single damascene" means an inlaid interconnect forming process by which a plug metal and an interconnect metal are embedded in two steps, while the term "dual damascene" means an inlaid interconnect forming process by which a plug metal and an interconnect metal are embedded simultaneously. A copper inlaid interconnect tends to be used as a multilayer structure.

12. The term "semiconductor device" as used herein means not only those particularly fabricated over a single crystal silicon substrate but also those fabricated on the other substrate such as SOI (Silicon On Insulator) substrate or a substrate for producing TFT (Thin Film Transistor) liquid crystal, unless otherwise specifically described.

13. The term "wafer" means silicon or the other semiconductor single crystal substrate (generally, nearly in a flat disk form, semiconductor wafer) used in the manufacture of semiconductor integrated circuits, sapphire substrate, glass substrate, other insulation or semi-insulation, semiconductor substrate or a combined substrate thereof.

14. The term "semiconductor integrated circuit chip or semiconductor chip (which will hereinafter be called "chip" simply) means a wafer completed of wafer process (or preliminary step) and divided into unit circuit groups.

15. The term "silicon nitride or a silicon nitride film" means not only $Si_3N_4$ but also an insulating film containing a nitride of silicon and having a similar composition.

16. The term "low dielectric constant insulating film (Low-K insulating film)" as used herein means, for example, an insulating film having a dielectric constant lower than that of a silicon oxide film (for example, TEOS (Tetraethoxysilane) oxide film) contained in a passivation film. A TEOS oxide film having a specific dielectric constant $\in$ not greater than about 4.1 or 4.2 is called a low dielectric constant insulating film.

In the below-described embodiments, a description will be made after divided in plural sections or in plural embodiments if necessary for convenience's sake. These plural sections or embodiments are not independent each other, but in a relation such that one is a modification example, details or complementary description of a part or whole of the other one unless otherwise specifically indicated.

In the below-described embodiments, when a reference is made to the number of elements (including the number, value, amount and range), the number of elements is not limited to a specific number but can be not greater than or less than the specific number unless otherwise specifically indicated or in the case it is principally apparent that the number is limited to the specific number.

Moreover in the below-described embodiments, it is needless to say that the constituting elements (including element steps) are not always essential unless otherwise specifically indicated or in the case where it is principally apparent that they are essential.

Similarly, in the below-described embodiments, when a reference is made to the shape or positional relationship of the constituting elements, that substantially analogous or similar to it is also embraced. This also applies to the above-described value and range.

In all the drawings for describing the embodiments, like members of a function will be identified by like reference numerals and overlapping descriptions will be omitted.

In the drawings used in the embodiments of the present invention, hatching is sometimes added to facilitate understanding of even a plane view.

In the embodiments of the present invention, MIS•FET (Metal Insulator Semiconductor Field Effect Transistor) representing a field effect transistor is abbreviated as MIS, a p channel type MIS•FET is abbreviated as pMIS and an n channel type MIS•FET is abbreviated as nMIS.

The embodiments of the present invention will next be described specifically based on accompanying drawings.
(Embodiment 1)

Figure 5:
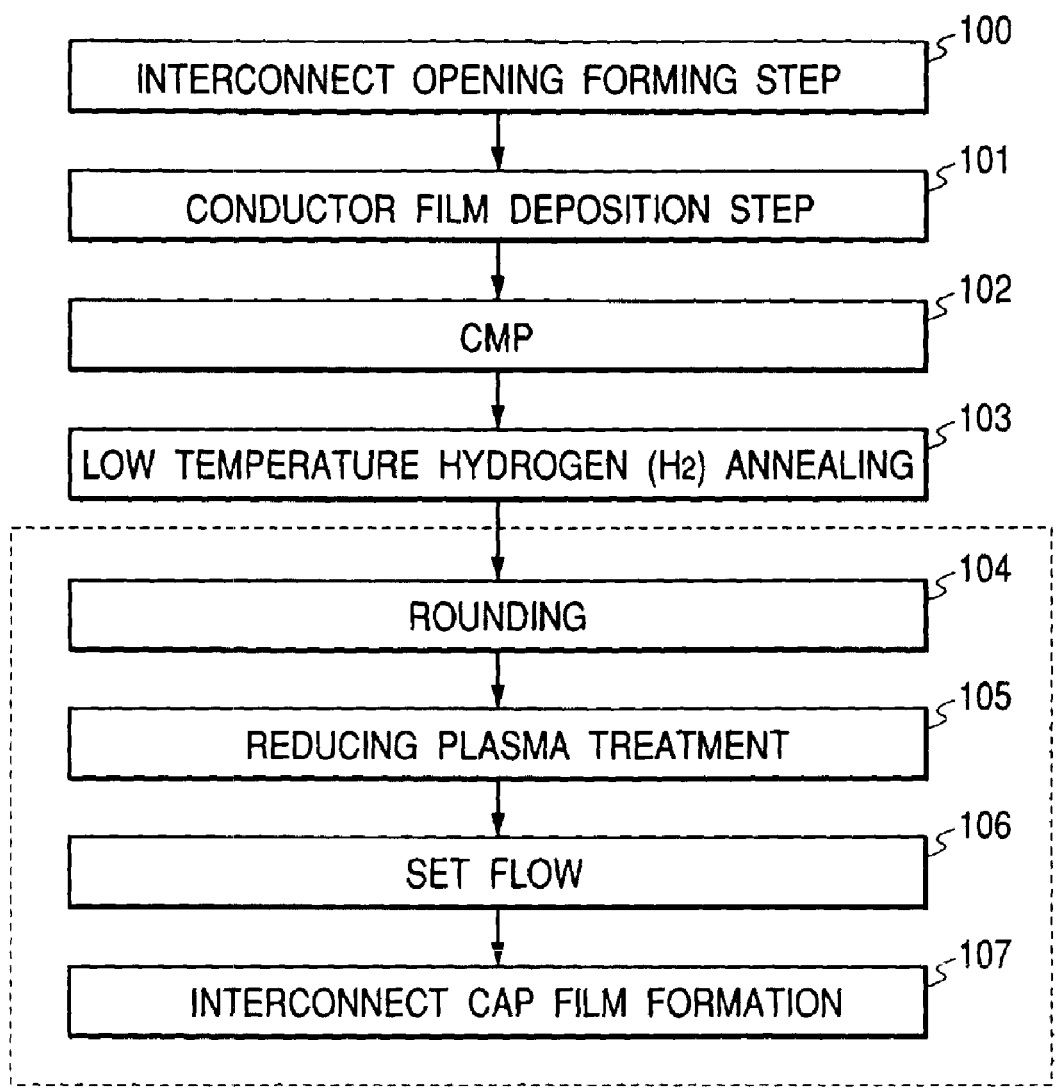
FIG. 5 is a flowchart of a manufacturing step of a semiconductor device according to one embodiment of the present invention.

In this Embodiment, based on FIGS. 6 to 18 in accordance with the production flowchart of FIG. 5, explanation is made on the case where the technical idea of the present invention is applied to a manufacturing method of a CMIS (Complimentary MIS)—LSI (Large Scale Integrated Circuit). The step encompassed with a dotted line in FIG. 5 shows the treatment in the same treating chamber.

Figure 6:
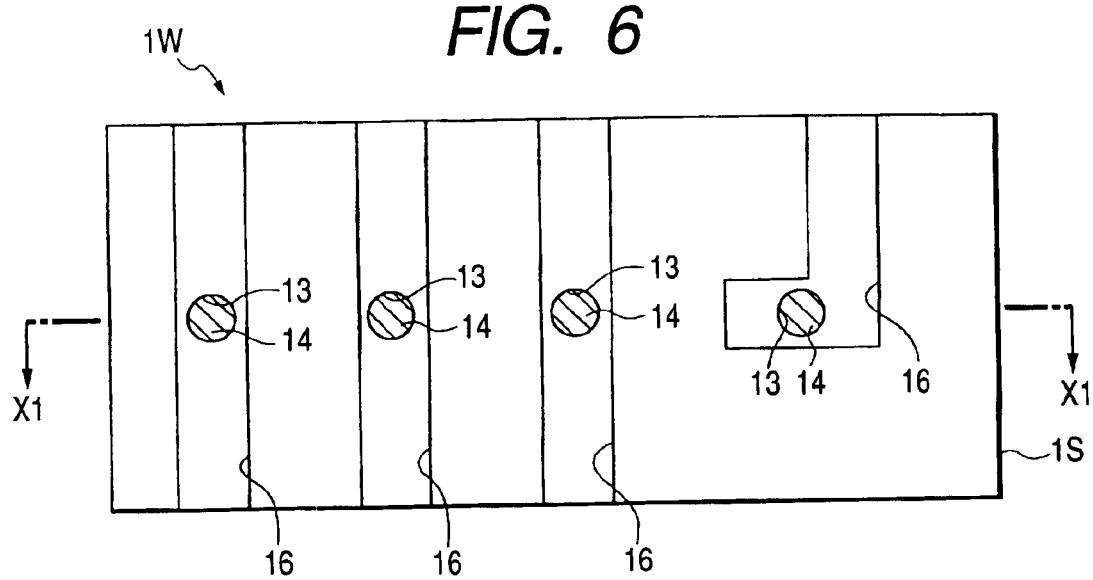
FIG. 6 is a fragmentary plane view of a semiconductor substrate during its manufacturing step according to one embodiment of the present invention.
Figure 7:
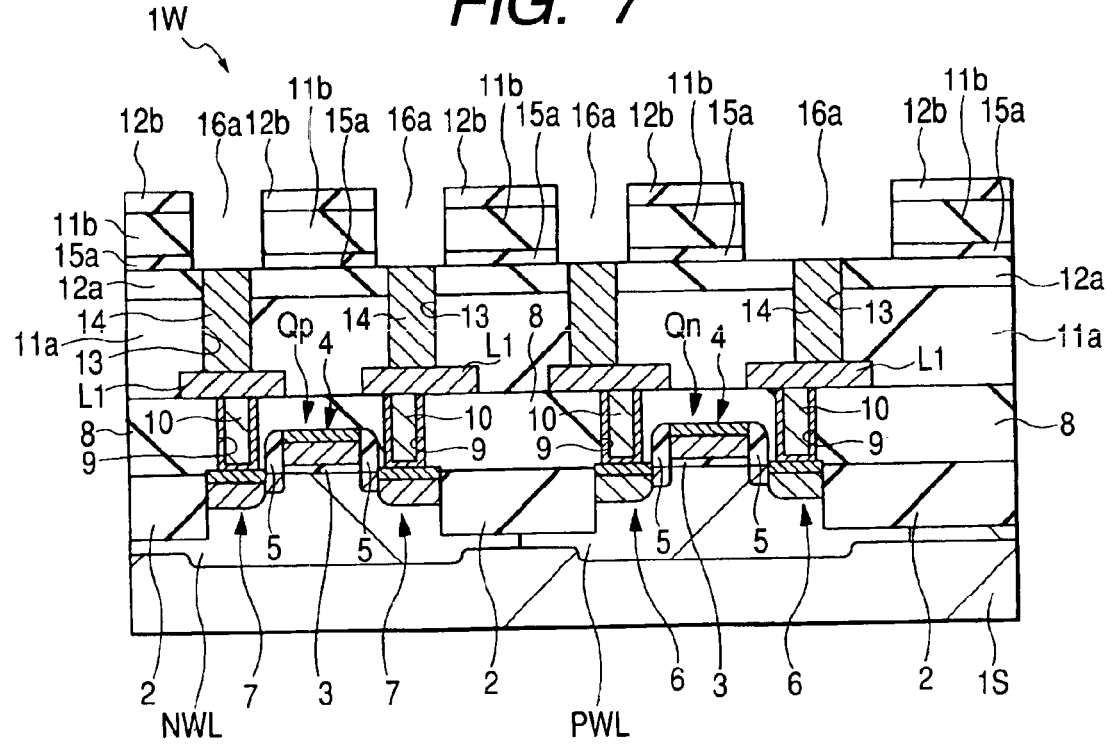
FIG. 7 is a cross-sectional view taken along a line X1—X1 of FIG. 6.

FIG. 6 is a fragmentary plane view of a CMIS-LSI during its manufacturing step and FIG. 7 is a cross-sectional view taken along a line X1—X1 of FIG. 6. A semiconductor substrate 1 (which will hereinafter be called "substrate" simply) constituting a wafer 1W is made of p-type single crystal silicon having a specific resistance of about 1 to 10 $\Omega$cm. The semiconductor substrate 1 has, on the main surface (surface on which a device is to be formed) thereof, an isolating trench (SGI (Shallow Groove Isolation) or STI (Shallow Trench Isolation)) 2. This isolation trench 2 is formed by embedding, for example, a silicon oxide film in a trench formed on the main surface of the substrate 1S. Also on the main surface side of the substrate 1S, a p type well PWL and an n type well NWL are formed. To the p type well PWL, boron is introduced, while to the n type well NWL, phosphorus is introduced. In the active regions of the p type well PWL and n type well NWL encompassed by the isolation trench 2, nMISQn and pMISQp are formed, respectively.

The gate insulating film 3 of each of the nMISQn and the pMISQn has a thickness of about 6 nm. The term "film thickness" as used herein means film thickness in terms of silicon dioxide, which does not always coincide with the actual film thickness. The gate insulating film 3 may be formed of a silicon oxynitride film instead of the silicon oxide film. In other words, segregation of nitrogen may be caused at the interface between the gate insulating film 3 and the substrate 1S. By using a silicon oxynitride film, the gate insulating film 3 is able to have improved hot carrier resistance, leading to an improvement in dielectric breakdown strength. Moreover, a silicon oxynitride film does not permit easy penetration of impurities compared with the silicon oxide film so that use of the former makes it possible to suppress fluctuations of a threshold voltage resulting from diffusion, to the side of the substrate 1S, of impurities in a gate electrode material. This silicon oxynitride film may be formed, for example, by heat treating the substrate 1S in an atmosphere containing a nitrogen gas such as NO, $NO_2$ or $NH_3$.

The gate electrode 4 of each of nMISQn and pMISQp is formed by stacking, over a low-resistance polycrystalline silicon film, a titanium silicide ($TiSi_x$) layer or a cobalt silicide ($CoSi_x$) layer. The gate electrode structure is not limited to the above-described one, and it may be a so-called polymetal gate structure formed of a laminate film of a low-resistance polycrystalline silicon film, a WN (tungsten nitride) film and a W (tungsten) film. On both side surfaces of the gate electrode 4, a side wall 5 made of silicon oxide is formed.

The semiconductor regions 6 for the source and drain of nMISQn have an $n^-$ type semiconductor region adjacent to a channel and an $n^+$ type semiconductor region connected to the $n^-$ type semiconductor region and disposed at a position apart from the channel by the space of the $n^-$ type semiconductor region. Into the n⁻ type semiconductor region and n⁺ type semiconductor region, phosphorus or arsenic is introduced. On the other hand, the semiconductor regions 7 for the source and drain of pMISQp have a p⁻ type semiconductor region adjacent to the channel and a p⁺ type semiconductor region connected to the p⁻ type semiconductor region and disposed at a position apart from the channel by the space of the p⁻ type semiconductor region. Into the p⁻ type semiconductor region and p⁺ type semiconductor region, boron is introduced. On a part of the upper surface of these semiconductor regions 6, 7, a silicide layer such as titanium silicide layer or cobalt silicide layer is formed.

An insulating film 8 is deposited over such a substrate 1S. This insulating film 8 is made of a film, for example, BPSG (Boron-doped Phospho Silicage Glass) film, having reflow properties high enough to fill therewith a narrow space in the gate electrodes 4, 4. The insulating film 8 may be an SOG (Spin On Glass) film formed by spin coating. The insulating film 13 has a contact hole formed therein. From the bottom of the contact hole 9, the upper surface (surface of a silicide layer) of the semiconductor region 6 or 7 is partially exposed. In this contact hole 9, a plug 10 is formed. This plug 10 is formed by depositing a titanium nitride (TiN) film and a tungsten (W) film over the insulating film 8 including the insides of the contact hole 9 by CVD and removing the unnecessary titanium nitride film and tungsten film over the insulating film 8 by CMP or etchback, thereby leaving these films only inside of the contact hole 9.

A first-level interconnect L1 made, for example, of tungsten is formed on the insulating film 8. The first-level interconnect L1 is electrically connected to the semiconductor region 6 or 7 for source/drain or gate electrode 4 of the nMISQn or pMISQp through the plug 10. As the first-level interconnect L1, not only a tungsten film but also but various films are usable. For example, a film of a simple substance such as aluminum (Al) or aluminum alloy, or a laminated metal film formed by using a metal film such as titanium (Ti) or titanium nitride (TiN) as the upper or lower layer of the above-described film of a simple substance.

Over the insulating film 8, an insulating film 11a is deposited to cover the first-level interconnect L1. This insulating film 11a is made of a low dielectric constant material (so-called Low-K insulating film, Low-K material) such as organic polymer or organic silica glass. Examples of the organic polymer include "SiLK" (product of The Dow Chemical CO./USA, specific dielectric constant: 2.7, heat resistant temperature: 490° C. or greater, dielectric breakdown strength: 4.0 to 5.0 MV/Vm) and "FLARE", a polyallyl ether (PAE) series material (product of Honeywell Electronic Materials/USA, specific dielectric constant: 2.8, heat resistant temperature: 400° C. or greater). This PAE material features high basic performance and excellent mechanical strength, thermal stability and cost performance. Examples of the organic silica glass (SiOC material) include "HSG-R7" (product of Hitachi Chemical Co., Ltd., specific dielectric constant: 2.8, heat resistant temperature: 650° C.), "Black Diamond" (product of Applied Materials, Inc./USA, specific dielectric constant: 3.0 to 2.4, heat resistant temperature: 450° C.) and "p-MTES" (product of Hitachi Kaihatsu, specific dielectric constant: 3.2). In addition, "CORAL" (product of Novellus Systems, Inc./USA, specific dielectric constant: 2.7 to 2.4, heat resistant temperature: 500° C.) and "Aurora 2.7" (product of Nippon ASM, specific dielectric constant: 2.7, heat resistant temperature: 450° C.) can be given as examples of another SiOC series material.

Also usable as the low dielectric constant material for the insulating film 11a are FSG (SiOF series material), HSQ (hydrogen silsesquioxane) series materials, MSQ (methyl silsesquioxane) series materials, porous HSQ series materials, porous MSQ series materials and porous organic materials. Specific examples of the HSQ series materials include "OCD T-12" (product of Tokyo Ohka Kogyo Co., Ltd., specific dielectric constant: 3.4 to 2.9, heat resistant temperature 450° C.), "FOx" (product of Dow Corning Corp./USA, specific dielectric constant: 2.9) and "OCL T-32" (product of Tokyo Ohka Kogyo, specific dielectric constant: 2.5, heat resistant temperature: 450° C.). Examples of the MSQ series materials include "OCD T-9" (product of Tokyo Ohka Kogyo; specific dielectric constant: 2.7, heat resistant temperature: 600° C.), "LKD-T200" (product of JSR, specific dielectric constant: 2.7 to 2.5, heat resistant temperature: 450° C.), "HOSP" (product of Honeywell Electronic Materials/USA, specific dielectric constant: 2.5, heat resistant temperature: 550° C.), "HSG-RZ25" (product of Hitachi Chemical, specific dielectric constant: 2.5, heat resistant temperature: 650° C.), "OCL T-31" (product of Tokyo Ohka Kogyo, specific dielectric constant: 2.3, heat resistant temperature: 500° C.) and "LKD-T400" (product of JSR, specific dielectric constant: 2.2 to 2, heat resistant temperature: 450° C.). Examples of the porous HSQ series material include "XLK" (product of Dow Corning Corp/ USA, specific dielectric constant: 2.5 to 2), "OCL T-72" (product of Tokyo Ohka Kogyo, specific dielectric constant: 2.2 to 1.9, heat resistant temperature: 450° C.), "Nanoglass" (product of Honeywell Electronic Materials/USA, specific dielectric constant: 2.2 to 1.8, heat resistant temperature: 500° C. or greater) and "MesoELK" (product of Air Products and Chemicals, Inc/USA, specific dielectric constant: 2 or less). Examples of the porous MSQ series material include "HSG-6211X" (product of Hitachi Chemical, specific dielectric constant: 2.4, heat resistant temperature: 650° C.), "ALCAP-S" (product of Asahi Kasei Kogyo, specific dielectric constant: 2.3 to 1.8, heat resistant temperature: 450° C.), "OCL T-77" (product of Tokyo Ohka Kogyo, specific dielectric constant: 2.2 to 1.9, heat resistant temperature: 600° C.), "HSG-6210X" (product of Hitachi Chemical, specific dielectric constant: 2.1, heat resistant temperature: 650° C.), and "silica aerogel" (product of Kobe Steel, specific dielectric constant: 1.4 to 1.1). Examples of the porous organic material include "PolyELK" (product of Air Products and Chemicals, Inc/USA, specific dielectric constant: 2 or less, heat resistant temperature: 490° C.). The above-described SiOC series materials or SiOF series materials are formed, for example, by CVD (Chemical Vapor Deposition). For example, the above-described "Black Diamond" is formed by CVD using a gas mixture of trimethylsilane and oxygen, while the above-described "p-MTES" is formed by CVD using a gas mixture of methyltriethoxysilane and $N_2O$. The other low dielectric constant insulating materials are formed, for example, by coating method.

Over the insulating film 11a made of such a Low-K material, an insulating film 12a for Low-K capping is deposited. This insulating film 12a is made of, for example, a silicon oxide ($SiO_x$) film typified by silicon dioxide ($SiO_2$) and has a function of maintaining the mechanical strength, protecting the surface and maintaining the moisture resistance of the insulating film 11a upon chemical mechanical polishing (CMP). The insulating film 12a is thinner than the insulating film 11a and its thickness is, for example, about 25 to 100 nm, preferably about 50 nm. The insulating film 12a is not limited to a silicon oxide film and various films are usable for it. For example, a silicon nitride ($Si_xN_y$) film, silicon carbide (SiC) film or silicon carbonitride (SiCN) film is usable. These silicon nitride film, silicon carbide film and silicon carbonitride film can be formed, for example, by plasma CVD. "BLOk" (product of AMAT, specific dielectric constant: 4.3) is a silicon carbide film formed by plasma CVD. For its formation, a gas mixture of trimethylsilane and helium (or $N_2$, or $NH_3$) is employed. In these insulating films 11a and 12a, a through-hole 13 from which a part of the first-level interconnect L1 is exposed is made. In this through-hole 13, a plug 14 made of, for example, tungsten is embedded.

First, in this embodiment, an insulating film 15a is deposited by plasma CVD over the above-described insulating film 12a and plug 14. This insulating film 15a is made of, for example, a silicon nitride film formed by plasma CVD and its film thickness is, for example, about 25 to 50 nm, preferably about 50 nm. Additional examples of the insulating film 15a may include films of a single substance such as a silicon carbide film formed by plasma CVD, an SiCN film formed by plasma CVD, and a silicon oxynitride (SiON) film formed by plasma CVD. Use of these films can drastically lower a dielectric constant compared with the use of a silicon nitride film, thereby lowering an interconnect capacitance and improving the operation speed of a semiconductor device. As the silicon carbide film formed by plasma CVD, "BLOk" (product of AMAT) can be given as one example. The gas used for film formation is as described above. For the formation of the SiCN film, a gas mixture of helium (He), ammonia ($NH_3$) and trimethylsilane (3MS) is used. As the silicon oxynitride film formed by plasma CVD, "PE-TMS" (product of Canon, specific dielectric constant: 3.9) can be given as an example. When the above-described silicon oxynitride film is employed, the film thickness is, for example, 25 nm to 50 nm, preferably about 50 nm. For its formation, a gas mixture of trimethoxysilane (TMS) and nitrogen oxide ($N_2O$) is used.

Subsequently, an insulating film (first insulating film) 11b and then an insulating film 12b are deposited on the insulating film 15a successively. The insulating film 11b and the insulating film 11a are made of insulating films equal in a dielectric constant. The insulating film 12b over the insulating film 11b is made of the same insulating film as used for the insulating film 12a and similar thereto, it functions as a Low-K capping insulating film. With a photoresist film as a mask, the insulating films 11b,12b are preferentially removed by dry etching, whereby an interconnect trench (interconnect opening) 16a is formed (Step 100 in FIG. 5). The interconnect trench 16a is formed by adjusting the etching selectivity of the insulating films 11b,12b greater than that of the insulating film 15a, thereby imparting the insulating film 15a with a function of an etching stopper. Described specifically, etching is stopped once on the surface of the insulating film 15a and then, the insulating film 15a is removed by selective etching. This makes it possible to improve the precision of the depth upon formation of the interconnect trench 16a and excessive etching of the interconnect trench 16a can be prevented. Such an interconnect trench 16a has, as shown in FIG. 6, a strip-like plane shape and from the bottom of the interconnect trench 16a, the upper surface of the plug 14 is exposed.

Figure 8:
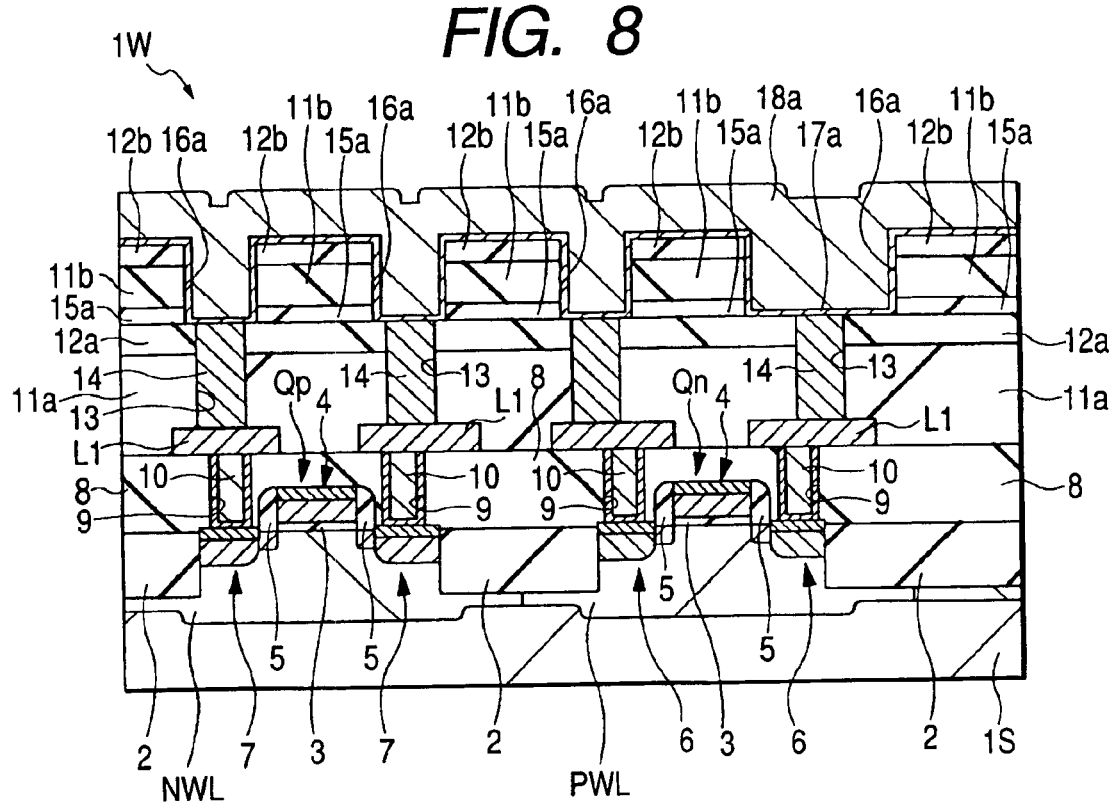
FIG. 8 is a cross-sectional view of a portion corresponding to the line X1—X1 of FIG. 5 in the manufacturing step of a semiconductor device following FIG. 7.
Figure 9:
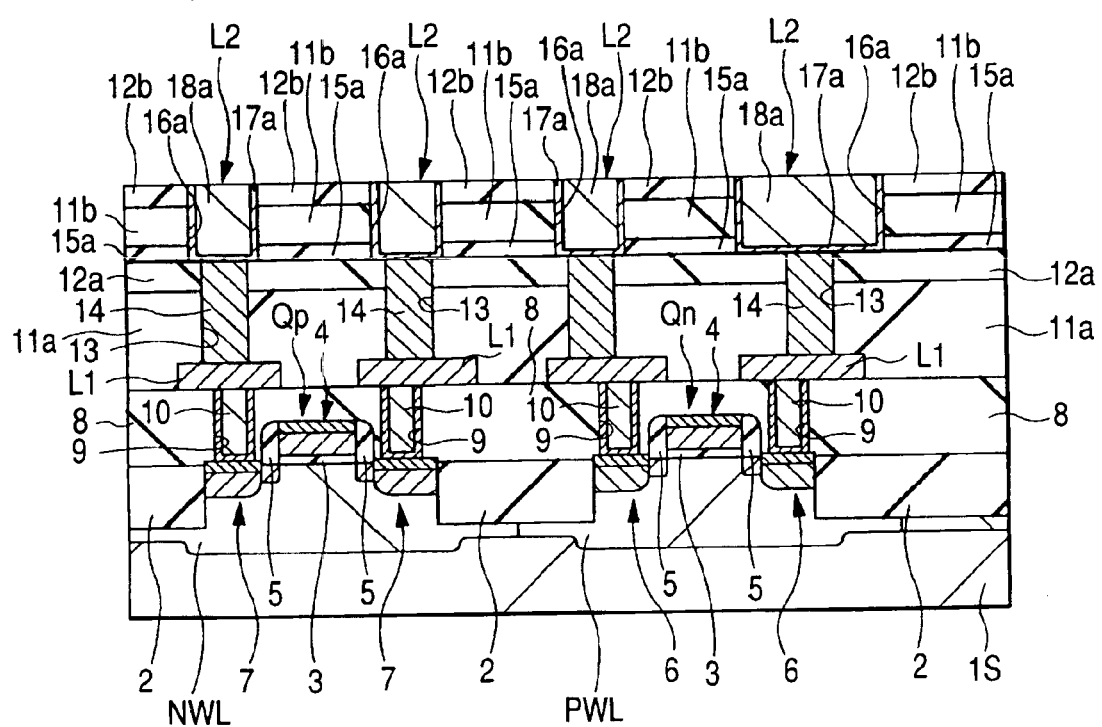
FIG. 9 is a cross-sectional view of the portion corresponding to the line X1—X1 of FIG. 5 in the manufacturing step of a semiconductor device following FIG. 8.

FIG. 8 is a fragmentary cross-sectional view of a portion of the semiconductor device corresponding to a line X1—X1 of FIG. 6 in its manufacturing step following FIG. 7, while FIG. 9 is a fragmentary cross-sectional view of a portion of the semiconductor device corresponding to a line X1—X1 of FIG. 6 in its manufacturing step following FIG. 8.

As illustrated in FIG. 8, a thin conductive barrier film (first conductor film) 17a made of, for example, titanium nitride (TiN) and having a thickness of about 50 nm is deposited all over the main surface of the substrate 1S by sputtering or the like method (Step 101 in FIG. 5). This conductive barrier film 17a has a function of preventing diffusion of copper used for the formation of a conductor film which will be described later, a function of improving adhesion of the main conductor film to the insulating films 11b, 12a, 12b and 15a, and a function of improving wetness with copper upon reflow of the main conductor film. As such a conductive barrier film 17a, use of, instead of titanium nitride, a refractory metal nitride such as tungsten nitride (WN) or tantalum nitride (TaN) which is a material almost unreactive with copper is preferred. In place of the titanium nitride, usable is a material of a refractory metal nitride added with silicon (Si) or a refractory metal such as tantalum (Ta), titanium (Ti), tungsten (W), titanium tungsten (TiW) alloy which does not easily react with copper. According to Embodiment 1, good TDDB characteristics are available even if the thickness of the conductive barrier film 17a is decreased to, for example, 10 nm, or to 6 to 7 nm, or even to 5 nm or less.

Subsequently, a main conductor film (second conductor film) 18a made of copper which is relatively thick and has a thickness of, for example, about 800 to 1600 nm is deposited over the conductive barrier film 17a (step 101 in FIG. 5). In this embodiment 1, the main conductor film 18a is formed, for example, by plating method. The use of plating method makes it possible to form, at a low cost, the main conductor film 18a having a good film quality and good filling property. In this case, a thin conductor film made of copper is first deposited on the conductive barrier film 17a by sputtering, and then a comparatively thick conductor film made of copper is grown thereover by electroplating or electroless plating, whereby the main conductor film 22a is deposited. For plating, a plating solution having copper sulfate as a main component is used. Alternatively, the main conductor film 18a can be formed by sputtering. Upon sputtering for the formation of the conductive barrier film 17a and conductor film 18a, ordinarily-employed sputtering is usable, but sputtering with high directivity such as long throw sputtering or collimate sputtering is preferably employed in order to improve the filling property and film quality. The main conductor film 18a can also be formed by CVD. Then, reflow of the conductor film 18a is caused by heat treatment of the substrate 1S in a nonoxidizing atmosphere (for example, a hydrogen atmosphere) at about 475° C., whereby copper is filled closely in the interconnect trench 16a.

Next, the main conductor film 18a and conductive barrier film 17a are polished by CMP (step 102 in FIG. 5). Ordinarily employed abrasive-using CMP treatment can be adopted here, but in Embodiment 1, CMP comprising two steps, that is, the above-described abrasive-free CMP (first step) and abrasive-using CMP (second step) is employed. This CMP treatment will next be described more specifically.

The first step is aims at preferential polishing of the main conductor film 18a made of copper. The polishing solution (slurry) contains an anticorrosive for the formation of a protective film, an oxidizing agent of copper and an etching component of the oxide film of copper, but is substantially free of an abrasive. The abrasive content of the polishing solution is 0.5 wt. % or less, preferably 0.1 wt. % or less, especially 0.05 wt. % or less, still more preferably 0.01 wt. % or less. The abrasive can however be incorporated in an amount of about 3 to 4% based on the total amount of the polishing agent. As the polishing solution, that adjusted to a pH belong to the corrosion area of copper is used. In addition, it is adjusted to have a composition so that the polishing selectivity of the main conductor film 18a relative to the conductive barrier film 17a is, for example, at least 5. As such a polishing solution, a slurry containing an oxidizing agent and an organic acid can be given as an example. Examples of the oxidizing agent include hydrogen peroxide ($H_2O_2$), ammonium hydroxide, ammonium nitrate and ammonium chloride, while those of the organic acid include citric acid, malonic acid, fumaric acid, malic acid, adipic acid, benzoic acid, phthalic acid, tartaric acid, lactic acid, succinic acid and oxalic acid. Of these, hydrogen peroxide is an oxidizing agent suited for the polishing solution, because it is free of a metal component and is not a strong acid. Citric acid is an organic acid suitable for the polishing solution, because it is generally used as a food additive, has low toxicity, is not so harmful as a waste, does not emit an odor and has high solubility in water. In this embodiment, used is a polishing solution obtained by adding 5 vol. % of hydrogen peroxide and 0.03 wt. % of citric acid to pure water, thereby adjusting an abrasive content to less than 0.01 wt. %. As an anticorrosive, BTA is, for example, employed.

The abrasive-free CMP of the first step polishes the main conductor film 18a mainly by a chemical factor while causing both protecting action and etching action of the main conductor film 18a. When chemical mechanical polishing with the above-described polishing solution is conducted, the copper surface is first oxidized by an oxidizing agent and a thin oxide layer is formed on its surface. Then, a substance which water-solubilizes the oxide, whereby the oxide layer is dissolved and appears as an aqueous solution. The thickness of the oxide layer decreases. A thinned portion of the oxide layer is exposed to the oxidizing substance again and increases its thickness. Chemical mechanical polishing proceeds as the above-described reaction is repeated. Removal of the protecting film is effected by the contact with a polishing pad. Such chemical mechanical polishing with an abrasive-free polishing solution is described specifically in Japanese Patent Application Nos. 299937/1997 and 317233/1998 applied by the inventors of the present application.

The second step subsequent to the first step is aimed at preferential polishing of the conductive barrier film 17a. This second step polishes the conductive barrier film 17a mainly by a mechanical factor by the contact with the polishing pad. The polishing solution usable here contains the above-described anticorrosive, the above-described oxidizing agent, and an etching component of an oxide film and in addition, an abrasive. In Embodiment 1, a polishing solution obtained by adding, to pure water, 5 vol. % of hydrogen peroxide, 0.03 wt. % of citric acid and 0.5 to 0.8 wt. % of an abrasive is used, but not limited thereto. The amount of the abrasive is determined mainly so as not to etch the underlying insulating film 12b. Its amount is set at, for example, 1 wt. % or less. As the abrasive, for example, colloidal silica ($SiO_2$) is used. Use of colloidal silica can drastically reduce the CMP damage on the polished surface of the insulating film 12b, thereby actualizing scratch-free polishing. Instead of colloidal silica, alumina ($Al_2O_3$) is usable as the abrasive. In this second step, the amount of the oxidizing agent is reduced compared with that in the first step, meaning a relative increase in the amount of an anticorrosive in the polishing solution. Polishing is conducted under the conditions in which polishing selectivity of the main conductor film 18a relative to the conductive barrier film 17a is lower than that in the above-described abrasive-free CMP, for example, at selectivity of 3 or less.

Polishing under such conditions in the second step can reinforce protection of the main conductor film 18a made of copper while suppressing its oxidation, making it possible to prevent excessive polishing of the main conductor film 18a and suppress or prevent dishing or erosion of it. As a result, an increase or fluctuations of an interconnect resistance can be suppressed or prevented, leading to an improvement in the performance of a semiconductor device.

By such CMP treatment, an inlaid second-level interconnect (interconnect) L2 is formed in the interconnect trench 16a as illustrated in FIG. 9. The inlaid second-level interconnect L2 has a relatively thin conductive barrier film 17a and a relatively thick main conductor film 18a and it is electrically connected with the first-level interconnect L1 through the plug 14. According to this Embodiment 1, use of the above-described CMP for polishing for the formation of the inlaid second-level interconnect L2 can drastically reduce the CMP damage on the polished surface of the insulating film 12b, actualizing the above-described scratch-free polishing. In the above-described example, the insulation-capping insulating film 12b is disposed over the insulating film 11b made of a Low-K material. CMP according to this Embodiment can actualize scratch-free polishing so that the insulation-capping insulating film (for example, insulating film 12b) is not necessarily disposed. In short, the insulating film 11b may be exposed to CMP. In Japanese Patent Application No. 2001-316557 (filed on Oct. 15, 2001) applied by the inventors of the present application and etc., the Low-K barrierless technique is disclosed.

The surface of the substrate 1S after polishing is then, subjected to anticorrosion treatment. This anticorrosion treatment section is similar in the constitution to the polishing treatment section. In this anticorrosion treatment section, the main surface of the substrate is is pressed against a polishing pad attached onto the surface of a platen. After mechanical removal of the polishing slurry, a chemical solution containing an anticorrosive such as benzotriazole (BTA) is fed to the main surface of the substrate 1S, whereby a hydrophobic protective film is formed on the surface portion of a copper interconnect formed on the main surface of the substrate IS. The substrate 1S after anticorrosion treatment is stored temporarily in an immersion treatment section in order to prevent the surface from drying. This immersion treatment section maintains the surface of the resulting anticorrosive substrate 1S wet until post-cleaning. For example, this section is designed to store a predetermined number of substrates 1S in the form immersed in an immersion tank (storage tank) overflowing with pure water. At this time, the inlaid second-level interconnect L2 can be prevented from corrosion more surely by feeding the immersion tank with pure water cooled to a temperature low enough to substantially prevent progress of electrochemical corrosion reaction of the inlaid second-level interconnect L2. The method of preventing the substrate from drying is not limited to the above-described method, that is, storage in the immersion tank but, in so far as at least the surface of the substrate 1S can be maintained wet, another method, for example, feeding the substrate with pure-water shower can be employed. This immersion treatment section (substrate storage section) may be designed to have a light-blocking structure to prevent exposure of the surface of the substrate 1S during storage to an illuminated light. This makes it possible to avoid generation of a short-circuit current due to photovoltaic effect. The description of such a CMP treatment and apparatus can be found, for example, in Japanese Patent Application Nos. 226876/1999 and 2000-300853 applied by the present inventors.

Then, a post-CMP cleaning step is conducted while keeping the surface of the substrate 1S wet. First, the substrate 1S is subjected to alkali cleaning. This treatment is aimed at removing foreign matter such as slurry upon CMP treatment. The acid slurry adhered to the substrate 1S during CMP is neutralized to arrange, in one direction, the zeta potentials of the substrate 1, foreign matter and cleaning brush. In order to eliminate an adsorbing force acted among them, scrub cleaning (or brush cleaning) of the surface of the substrate 1 is conducted while supplying thereto a weak alkali agent solution, for example, of nearly pH 8 or greater.

Figure 10:
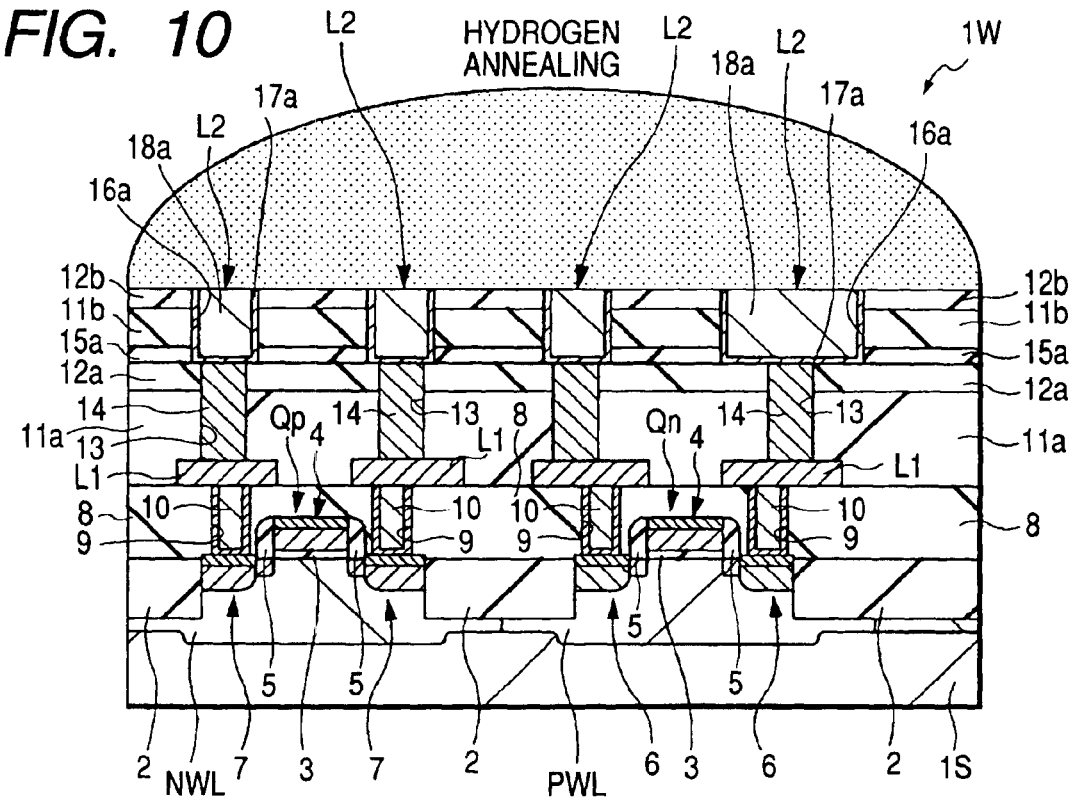
FIG. 10 is a cross-sectional view of the portion corresponding to the line X1—X1 of FIG. 5 in the manufacturing process of a semiconductor device following FIG. 9.

FIG. 10 is a cross-sectional view of a portion of the semiconductor device corresponding to the line X1—X1 of FIG. 5 during its manufacturing step following FIG. 9. Here, the substrate 1S (particularly the CMP surface from which the inlaid second-level interconnect L2 is exposed) is subjected to reducing treatment. Described specifically, the substrate 1S (particularly, the CMP surface) is heat treated, for example, in a hydrogen gas atmosphere at 200 to 475° C., preferably 300° C., for 0.5 to 5 minutes, preferably about 2 minutes (hydrogen ($H_2$) annealing treatment, Step 103 in FIG. 5). This treatment makes it possible to reduce, to copper, the copper oxide film on the surface of the inlaid second-level interconnect L2 formed upon CMP, thereby suppressing or preventing the etching of the inlaid second-level interconnect L2 which will otherwise occur by the subsequent acid cleaning. As a result, it is possible to suppress or prevent simultaneously an increase in an interconnect resistance, fluctuations in an interconnect resistance and the occurrence of a step difference and also the occurrence of etch corrosion. Without this reducing treatment, an organic matter such as BTA adhered to the surface of the substrate 1S upon CMP treatment may become a mask upon cleaning and disturb smooth etching of the surface layer of the insulating film 12b. However, by the reducing treatment as in Embodiment 1, an organic matter such as BTA adhered upon CMP can be removed so that the surface layer of the insulating film 12b can be removed sufficiently and uniformly. The TDDB life of the semiconductor device can be improved markedly by this reducing treatment. The above-described hydrogen annealing is particularly suited for use in the formation, by plating, of a copper-series main conductor film for inlaid interconnect. Such hydrogen annealing treatment can cause recrystallization of copper formed by plating so that an interconnect resistance can be reduced. In addition, hydrogen annealing treatment can suppress or prevent peeling of a capping film due to heat stress. In some cases, however, hydrogen annealing treatment is unnecessary. This hydrogen annealing treatment may be conducted after post-CMP cleaning treatment (including acid cleaning and drying which will be described later) but prior to reducing plasma treatment which will be described later.

Acid cleaning of the substrate 1S is then conducted. Its is aimed at improving the TDDB characteristics, removing the remaining metal, decreasing the dangling bonds on the surface of the insulating film 12b, removing the unevenness on the surface of the insulating film 12b and the like. A hydrofluoric acid solution is fed to the surface of the substrate 1S to remove foreign particles due to etching. The mere insertion of hydrofluoric acid cleaning can improve the TDDB characteristics, which is considered to result from an improvement in adhesion at the interface because the damaged layer is removed from the surface by acid treatment. The substrate 1S is then dried by a spin drier and provided for the subsequent step.

In the above-described example, description was made on the alkali cleaning treatment, reducing treatment and acid cleaning treatment conducted in the order of mention. This has attained an improvement in TDDB characteristics by about 2 figures compared with those of the alkali cleaning—acid cleaning sequence. The sequence of the treatments is not limited to the above-described one but can be varied. For example, CMP treatment and then reducing treatment are conducted, followed by alkali cleaning treatment and acid cleaning treatment in this order as post-cleaning treatment. Alternatively, a sequence of alkali cleaning treatment, reducing treatment and acid cleaning treatment may be employed. TDDB characteristics can be improved only by acid cleaning. Prior to or concurrently with the above-described post-CMP cleaning treatment, the surface of the substrate 1S may be subjected to pure-water scrub cleaning, pure-water ultrasonic cleaning, running pure-water cleaning or pure-water spin cleaning; or the back surface of the substrate 1S may be subjected to pure-water scrub cleaning. Cleaning methods, hydrogen annealing methods and action or effects of the sequence of these treatments are described in detail in Japanese Patent Application 2001-131941 (filed on Apr. 27, 2001) applied by the inventors of the present application.

The wafer 1W, after drying treatment, is then carried in a plasma enhanced CVD system for the formation of an interconnect capping insulating film. No particular limitation is imposed on the plasma enhanced CVD system, but in this Embodiment, a diode parallel plate plasma enhanced CVD system is employed.

Figure 11:
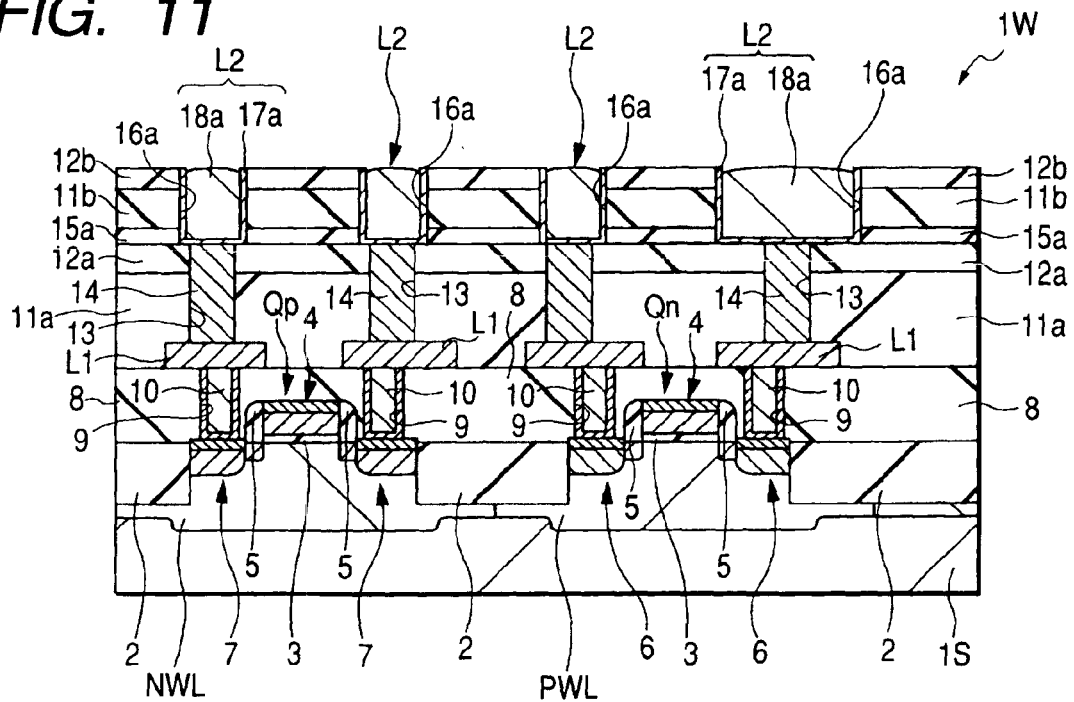
FIG. 11 is a cross-sectional view of the portion corresponding to the line X1—X1 of FIG. 5 in the manufacturing step of a semiconductor device following FIG. 10.
Figure 12:
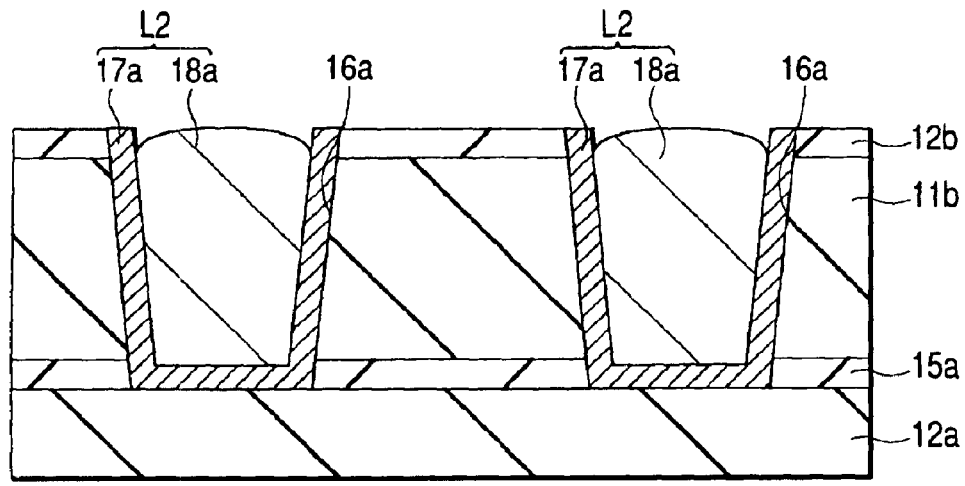
FIG. 12 is a fragmentary enlarged cross-sectional view of FIG. 11.

In this Embodiment 1, the wafer 1W is supported in the treating chamber of the plasma enhanced CVD system and heat treated while a nitrogen gas ($N_2$) is fed to the apparatus. In other words, the main surface (CMP surface) of the wafer 1W is subjected to annealing treatment in a nitrogen gas flow atmosphere. By this treatment, the upper surface (CMP surface, first surface) of the main conductor film 18a of the inlaid second-level interconnect L2, particularly at the contact portion (upper corner) with the conductive barrier film 17a is rounded (Step 104 in FIG. 5). FIG. 11 is a cross-sectional view of a portion of the semiconductor device corresponding to the line X1—X1 of FIG. 6 in its manufacturing step after such rounding treatment, while FIG. 12 is a fragmentary enlarged cross-sectional view of FIG. 11. According to Embodiment 1, the upper corner on the CMP surface side of the main conductor film 18a in the inlaid second-level interconnect L2 is chamfered and a round taper is formed. In other words, the main conductor film 18a on the CMP side is formed to have a cross-sectional shape having a greater distance from the conductive barrier film 17a at the upper part in FIG. 11 or 12. The size of the round taper at the upper corner of the main conductor film 18a is defined by the width and height of the interconnect trench 16a (particularly defined by a gradient of a normal line). The width of the round taper (the width in the direction horizontal to the upper surface of the main conductor film 18a) is greater than the thickness of the gate insulating film 3.

The temperature (almost the temperature of the wafer 1W) of a susceptor on which the wafer 1W is placed during such a heat treatment in a nitrogen gas atmosphere is about 360 to 400° C. Heat treatment is conducted, for example, about 1 minute. When the pressure during this heat treatment is set relatively high, the main conductor film 18a can be rounded easily. A hydrogen gas can be used as a treatment gas, but use of a nitrogen gas makes it possible to form a good round taper at a relatively low temperature range. As illustrated in FIG. 12, a taper having a wider interconnect width in an upward direction is formed on the side walls of the inlaid second-level interconnect L2. The angle a formed between the side surface of the inlaid second-level interconnect L2 and the upper surface of the insulating film 11a falls within a range of from 80 to 90°, more specifically, about 88.7°. The width (upper side width of the interconnect trench 16a) on the upper side of the inlaid second-level interconnect L2 and the distance, on the upper side, between two adjacent inlaid second-level interconnects (distance between the upper corners of the two adjacent inlaid second-level interconnects L2) is, for example, 0.25 µm or less, or 0.2 µm or less. The minimum pitch between two adjacent inlaid second-level interconnects L2 is, for example, 0.5 µm or less. The interconnect trench 16a has an aspect ratio of about 1.

Figure 13:
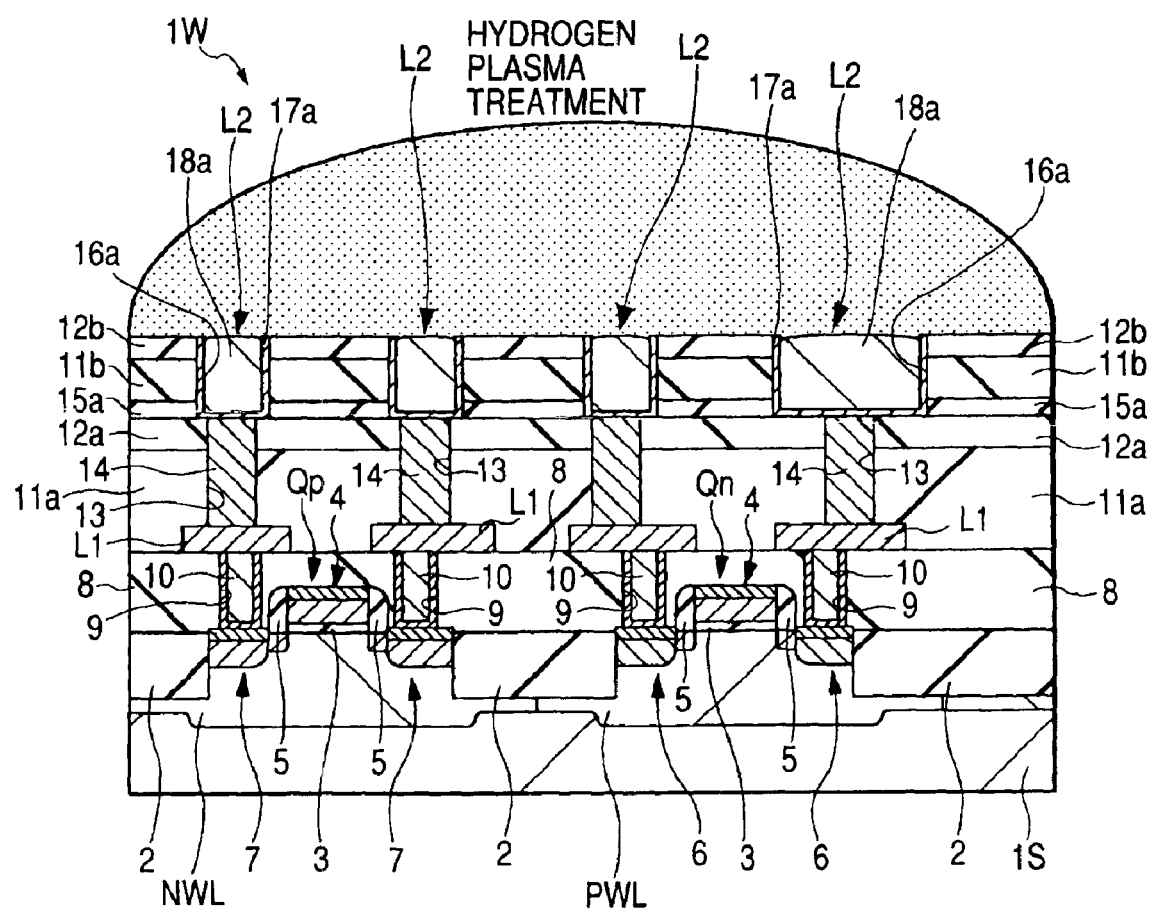
FIG. 13 is a cross-sectional view of the portion corresponding to the line X1—X1 of FIG. 5 in the manufacturing step of a semiconductor device following FIGS. 11 and 12.
Figure 14:
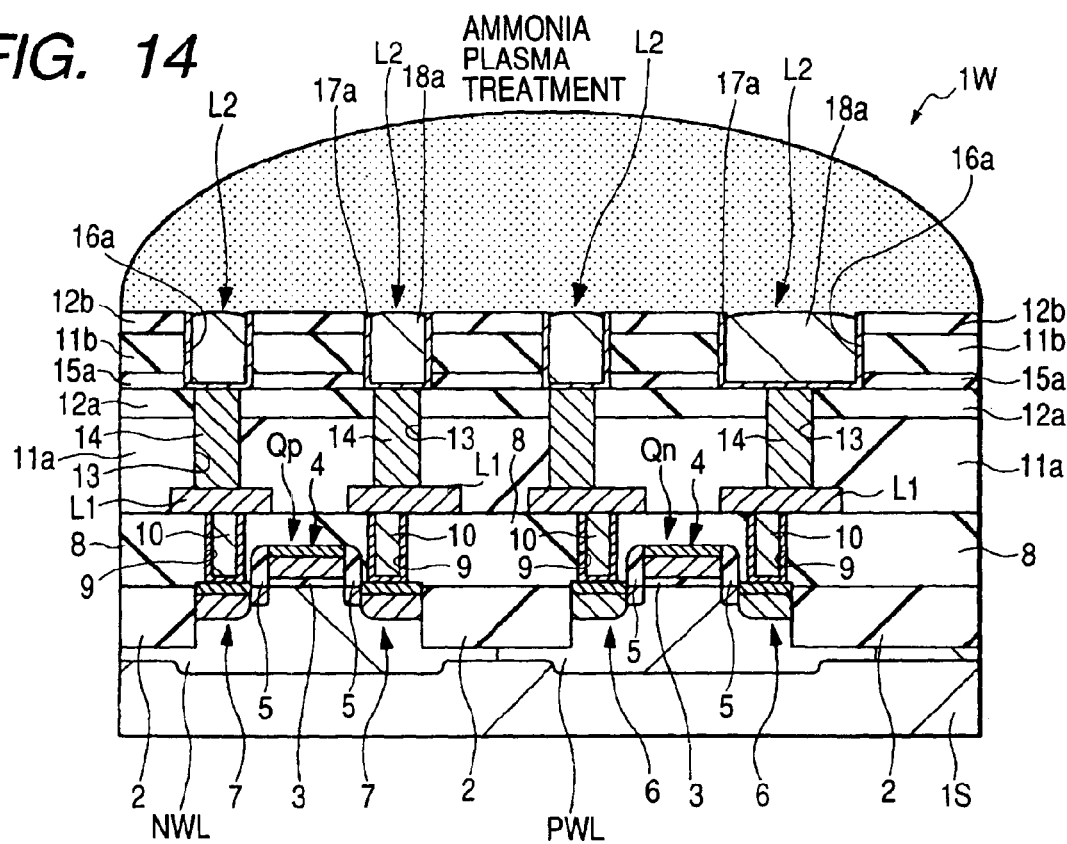
FIG. 14 is a cross-sectional view of the portion corresponding to the line X1—X1 of FIG. 5 in the manufacturing step of a semiconductor device following FIG. 13.

The nitrogen gas is then discharged from the treating chamber of the plasma enhanced CVD system and the plasma supply is ceased by powering-off. Then, the wafer 1W is subjected to reducing plasma treatment as described below (Step 105 in FIG. 5). FIGS. 13 and 14 are each a cross-sectional view of a portion of the wafer 1W corresponding to the line X1—X1 of FIG. 5 during the reducing plasma treatment.

After a hydrogen gas is fed to the treating chamber of the plasma enhanced CVD system, the substrate 1S (particularly, the CMP surface from which the inlaid second-level interconnect L2 is exposed) is subjected to hydrogen plasma treatment as illustrated in FIG. 13 by applying plasma power. The hydrogen plasma treatment, for example, of the substrate 1S having a diameter of 8 inches (about 200 mm), is conducted under the following conditions: treatment pressure of 5.0 Torr (=6.6661×$10^2$ Pa), radio frequency (RF) power of 600 W, substrate temperature of 400° C., hydrogen gas flow rate of 500 cm$^3$/min and treatment time of from 10 to 30 seconds. The electrode-to-electrode distance is set at 600 mils (15.24 mm). For the treatment, a gas composed alone of hydrogen (H) or a gas mixture of hydrogen (H) and nitrogen (N) is used.

As described in Japanese Patent Application Nos. 226876/1999 and 2000-300853 applied by the present inventors, such a hydrogen plasma treatment has a high removing capacity of an organic substance (high as compared with ammonia plasma treatment which will be described later) so that it can almost completely remove BTA and slurry component contained in the slurry upon CMP, the organic acid used for post-CMP cleaning and an organic residue generated during the process, thereby decreasing a leak current at the interface. As a result, the TDDB life can be improved further.

After discharge of the hydrogen gas from the treating chamber of the plasma enhanced CVD system and turning-off of the plasma power, the surface of the substrate 1S (the CMP surface from which the inlaid second-level interconnect L2 is exposed) is subjected to ammonia (NH$_3$) plasma treatment by feeding an ammonia gas to the treating chamber of the plasma enhanced CVD system without release of the chamber to the air and applying plasma power. The ammonia plasma treatment of the substrate 1S having, for example, a diameter of 8 inches (about 200 mm), is conducted under the following conditions: treatment pressure of about 0.5 to 1.0 Torr (=66.6612 to 133.332 Pa), power applied to the upper electrode of the plasma treatment apparatus of about 500 to 1000 W, power applied to the lower electrode of the plasma treatment apparatus of about 0 to 1000 W (preferably, 0), substrate temperature of about 300 to 400° C., ammonia gas flow rate of about 500 to 1500 cm$^3$/min, and treating time of about 5 to 60 seconds. The electrode-to-electrode distance is set at 300 to 600 mils (7.62 to 15.24 mm).

By such ammonia plasma treatment, copper oxide (CuO, CuO$_2$) on the surface of the copper interconnect oxidized upon CMP is reduced to copper (Cu), and in addition, a copper nitride (CuN) layer for preventing silicidation of copper upon set flow is formed on the surface (markedly shallow region) of the inlaid second-level interconnect L2. On the upper surface (markedly shallow region) of the insulating film 12b between interconnects, the formation of SiN or SiH proceeds to compensate for the dangling bonds on the surface of the insulating film 12b, which can also improve the adhesion between the capping insulating film which will be described later and the inlaid second-level interconnect L2 or insulating film 12b, and reduce the leak current through the interface. This also brings about improvement in the TDDB life.

By carrying out hydrogen plasma treatment and ammonia plasma treatment in this order, it is possible to reduce the surface of the inlaid second-level interconnect L2 composed mainly of copper, form a silicide barrier layer, clean the interface of the insulating film 12b and bring about SiH or SiN effects. Thus, further improvement in reliability can be achieved. It has been revealed by the present inventors that a sample obtained by forming an interlayer insulating film by depositing a silicon nitride film, which has been formed by plasma CVD, over a silicon oxide film, which has been formed by plasma CVD using, for example, a TEOS (Tetraethoxysilane) gas, and then conducting hydrogen plasma treatment and ammonia plasma treatment in combination, shows about a double digit improvement in TDDB life as compared to a sample subjected to only ammonia plasma treatment. The test by the present inventors have also revealed that even if the above-described SiLK is employed as an interlayer insulating film, sufficient reliability can be accomplished under operation environment at about 0.13 to 0.17 Mv/cm for 10 years when hydrogen plasma and ammonia plasma are employed in combination.

It is to be noted that the reducing plasma treatment conditions are, of course, not limited to the above-described ones. According to the investigation by the present inventors, plasma damage can be decreased with an increase in the pressure, while the fluctuations of the TDDB life in the substrate can be reduced and the TDDB life can be extended with an increase in the substrate temperature. Also, there have obtained the finding that hillocks are caused more readily on the surface of copper as the substrate temperature, RF power and treatment time increase. Considering these findings and fluctuations in the conditions depending on the structure of the device, the reducing plasma treatment conditions can be set as follows: treatment pressure of from 0.5 to 6 Torr (=0.66661×$10^2$ to 7.99932×$10^2$ Pa), RF power of from 300 to 600 W, substrate temperature of 350 to 450° C., hydrogen gas flow rate of from 50 to 1000 cm$^3$/min, ammonia gas flow rate of 20 to 500 cm$^3$/min, treatment time of from 5 to 180 seconds, and electrode-to-electrode distance of from 150 to 1000 mils (3.81–25.4 mm).

In the above-described example, hydrogen plasma treatment is followed by ammonia plasma treatment. The order is not limited to it but various modifications can be employed. For example, after ammonia plasma treatment, it is possible to continuously carry out hydrogen plasma treatment while maintaining vacuum state. Alternatively, only ammonia plasma treatment may be conducted as reducing treatment. In such cases, the TDDB life can be improved.

In the above-described example, the round taper forming step was followed by the reducing plasma treatment. These treatments were conducted in this order to maintain the stabilizing effects, by the reducing plasma treatment, on the surface of the main conductor film 18a. Alternatively, the round taper may be formed after the reducing plasma treatment. Or, the round taper may be formed after hydrogen plasma treatment, followed by ammonia plasma treatment. Reducing treatment and round taper formation may be conducted simultaneously. The temperature of the susceptor (roughly meaning the temperature of the wafer 1W) when the reducing treatment and round taper formation are conducted simultaneously is, for example, about 350 to 400° C. and treatment time is, for example, 1 to 3 minutes, preferably about 2 minutes.

Figure 15:
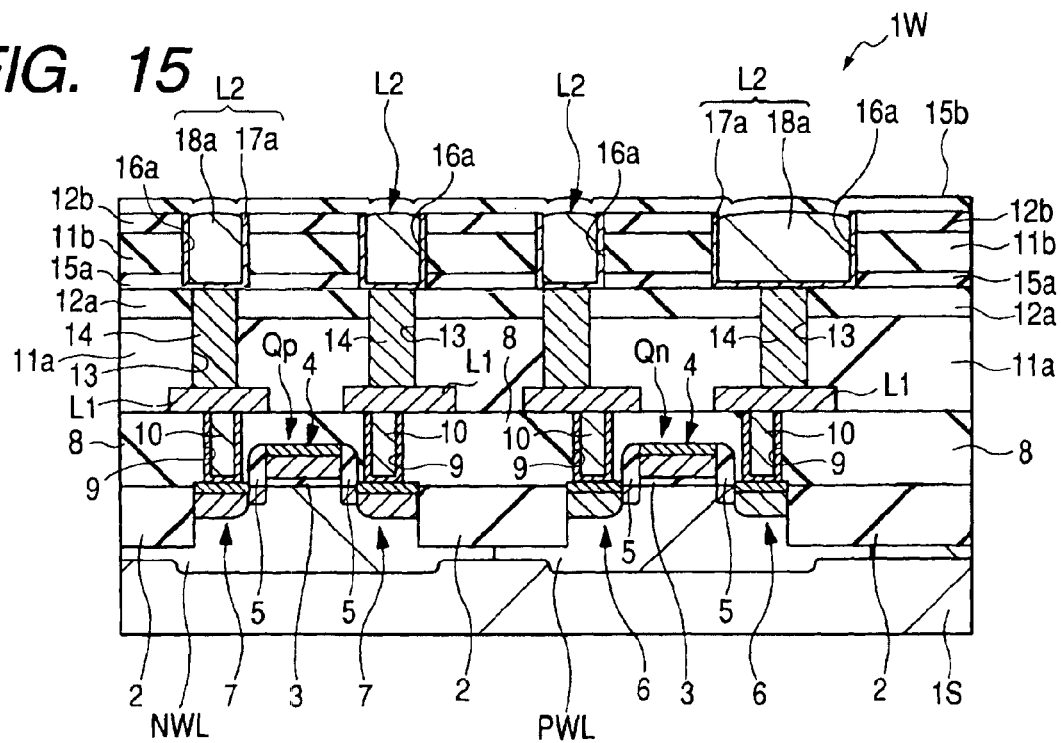
FIG. 15 is a cross-sectional view of the portion corresponding to the line X1—X1 of FIG. 5 in the manufacturing process of a semiconductor device following FIG. 14.

After discharge of an ammonia gas from the treating chamber of the plasma enhanced CVD system and turning-off of plasma power, set flow (Step 106 in FIG. 5) is conducted and then, an interconnect capping insulating film is deposited over the main surface of the wafer 1W by plasma CVD (Step 107 in FIG. 5). FIG. 15 is a cross-sectional view of a portion of the wafer 1W corresponding to the line X1—X1 of FIG. 5 after deposition of the interconnect capping insulating film (second insulating film, which will also be a first insulating film later). The insulating film 15b is similar in raw material and thickness to the insulating film 15a.

The above-described set flow is also called "stabilization" and it is a preparatory step mainly for heightening the film forming stability prior to the formation of the interconnect capping insulating film. The film formation follows this set flow. Described specifically, several tens of seconds after a carrier gas is fed to the treating chamber of a plasma enhanced CVD system, a treatment gas is also fed to the treating chamber without stopping the flow of the carrier gas. After maintaining this state for several seconds (set flow), film forming treatment is started by applying plasma power. For the formation of the insulating film 15b from a silicon nitride film, a nitrogen gas is employed as the carrier gas upon set flow and an ammonia gas ($NH_3$) and a silane gas ($SiH_4$) are employed as the treatment gas. For the formation of the insulating film 15b from a silicon carbide film, a helium gas (He) is employed as the carrier gas upon set flow and a trimethylsilane gas (3MS) is used as the treatment gas. For the formation of the insulating film 15b from SiCN, a helium gas (He) is employed as the carrier gas upon set flow and an ammonia gas ($NH_3$) and a trimethylsilane gas (3MS) are employed as the treatment gas. For the formation of the insulating film 15b from a silicon oxynitride gas, a trimethoxysilane gas (TMS) and nitrogen oxide ($N_2O$) are employed as the treatment gas upon set flow.

Figure 16:
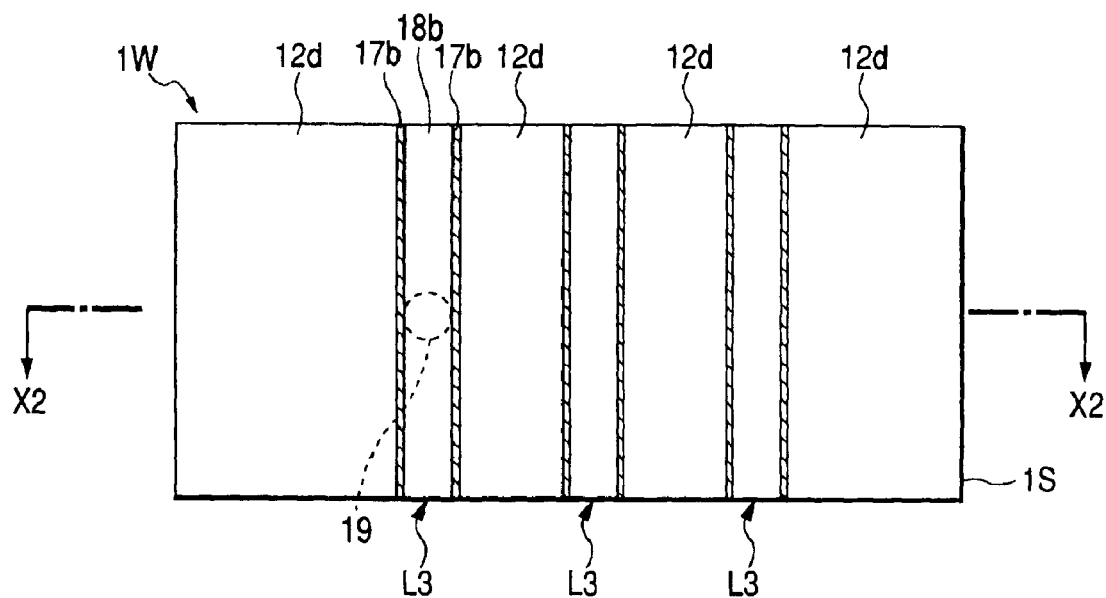
FIG. 16 is a fragmentary plane view of the semiconductor device during its manufacturing step following FIG. 15.
Figure 17:
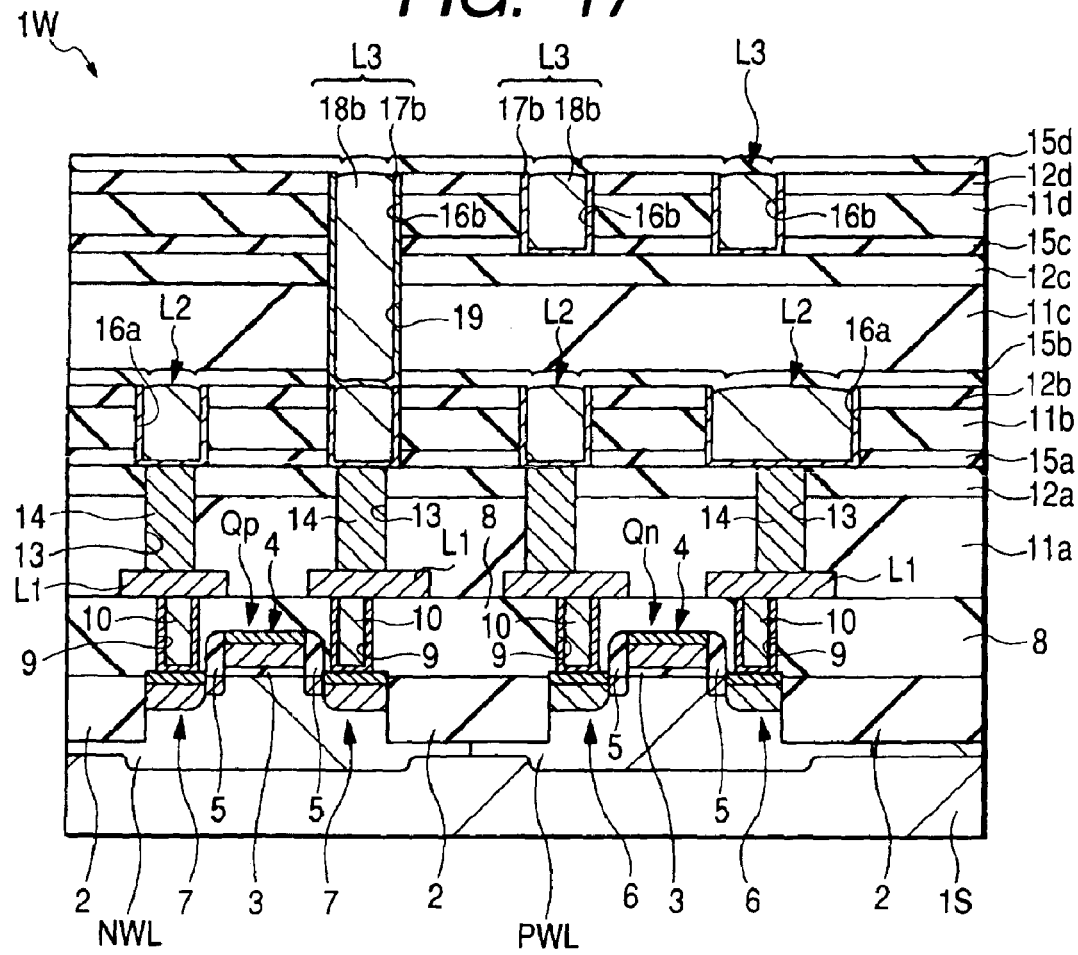
FIG. 17 is a cross-sectional view taken along a line X2—X2 of FIG. 16.

FIG. 16 is a fragmentary plane view of the semiconductor device during the manufacturing step following FIG. 15, while FIG. 17 is a cross-sectional view taken along a line X2—X2 of FIG. 16. Here, an inlaid third-level interconnect (interconnect) L3 is illustrated. Over the interconnect capping insulating film 15b, an insulating film (first insulating film) 11c is deposited. The insulating film 11c is similar in material and forming method to the insulating films 11a,11b using the above-described Low-K material. Over this insulating film 11c, an insulating film (first insulating film) 12c is deposited. The insulating material 12c is similar in material, forming method and function to the insulating films 12a,12b. Over this insulating film 12c, an insulating film 15c is deposited. The insulating film 15c is similar in material, forming method and function to the insulating films 15a,15b. Over this insulating film 15c, an insulating film (first insulating film) 11d is deposited. This insulating film 11d is similar in material and forming method to the insulating films 11a to 11c using the above-described Low-K material. Over this insulating film 11d, an insulating film (first insulating film) 12c is deposited. The insulating film 12d is similar in material, forming method and function to the insulating films 12a to 12c. According to this Embodiment 1, by forming a plurality of insulating films of interconnect layers from a material having a low dielectric constant as described above, the whole interconnect capacitance can be reduced, making it possible to improve operation speed of the semiconductor device having a copper series inlaid interconnect structure.

In these insulating films 15c,11d,12d, an interconnect trench (interconnect opening) 16b which is in the strip form when viewed from the top is formed. In this interconnect trench 16b, a conductive barrier film 17b and a main conductor film 18b are embedded and they constitute the inlaid third-level interconnect L3. In the insulating films 15b,11c,12c, formed is a through-hole (interconnect opening) 19 which is a substantially circular shape when viewed from the top and extends from the bottom surface of the interconnect trench 16b to the upper surface of the inlaid second-level interconnect L2. The inlaid third-level interconnect L3 is electrically connected to the inlaid second-level interconnect L2 via the conductive barrier film 17b and main conductor film 18b embedded in the through-hole 19. This inlaid third-level interconnect L3 is formed by the dual damascene method. Described specifically, after formation of the interconnect trench 16b in the insulating films 15c, 11d,12d and through-hole 19 in the insulating films 15b,11c, 12c, the conductive barrier film 17b and main conductor film (second conductor film) 18b are deposited successively. In other words, the interconnect trench 16b and through-hole 19 are embedded simultaneously with the conductive barrier film 17b and main conductor film 18b. These conductive barrier film 17b and main conductor film 18b are deposited in a similar manner to that employed for the conductive barrier film 17a and main conductor film 18a of the inlaid second-level interconnect. The conductive barrier film 17b and main conductor film 18b are also similar in material to the conductive barrier film 17a and main conductor film 18a. After polishing these conductive barrier film 17b and main conductor film 18b by CMP as in the formation of the inlaid second-level interconnect L2, steps similar to those employed for the formation of the inlaid second-level interconnect L2 are conducted to form the inlaid third-level interconnect L3. Similar to the inlaid second-level interconnect L2, the inlaid third-level interconnect L3 has, at the upper corner thereof, a round taper. Over these insulating film 12d and inlaid third-level interconnect L3, an interconnect capping insulating film (second insulating film, which may be a first insulating film later) 15d is deposited. This insulating film 15d is similar to the insulating films 15a,15b.

Figure 18:
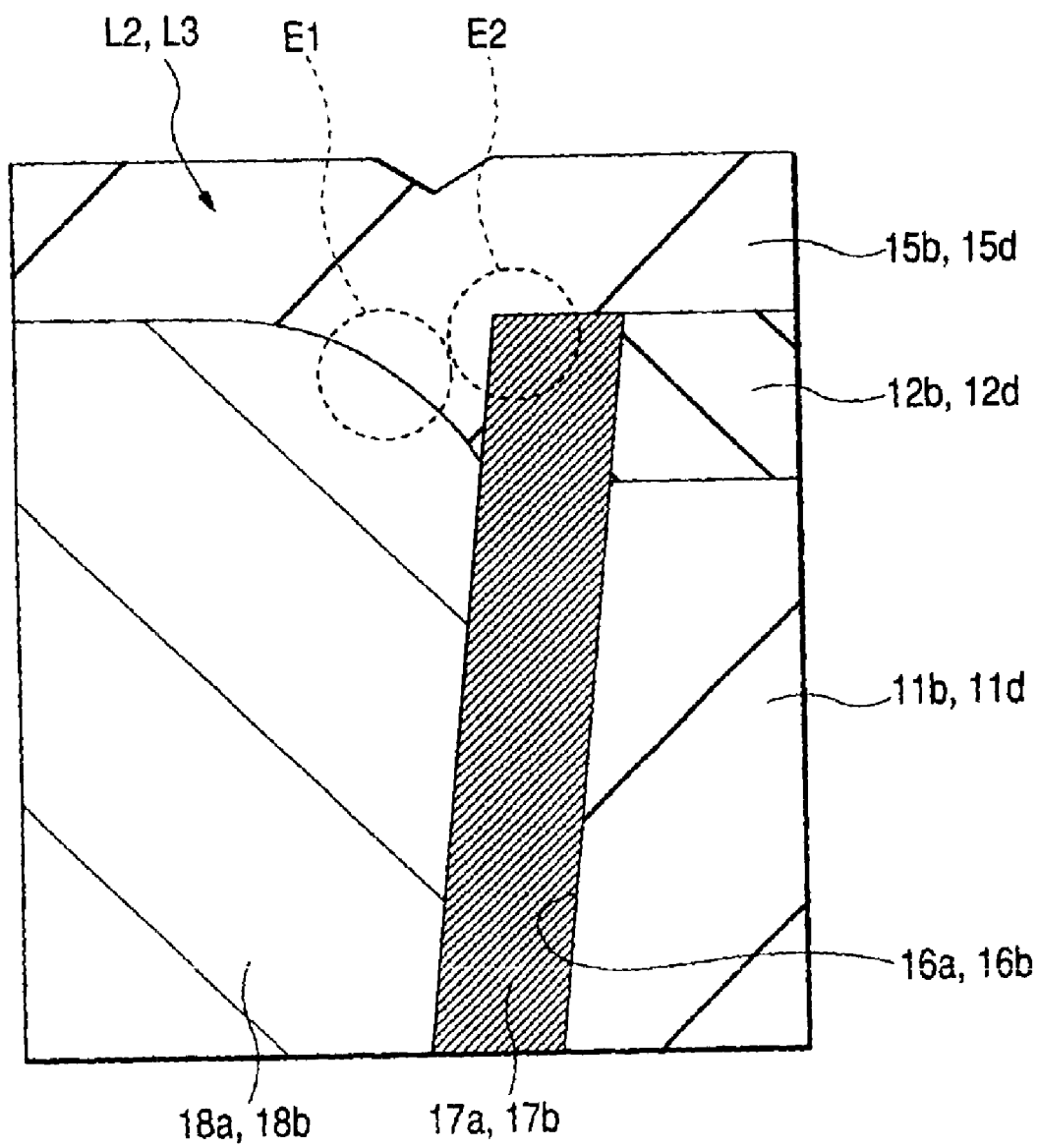
FIG. 18 is a fragmentary enlarged cross-sectional view of FIG. 17.

FIG. 18 is a fragmentary enlarged cross-sectional view of the inlaid second-level interconnect L2 or inlaid third-level interconnect L3. According to this Embodiment, the main conductor film 18a or 18b of the inlaid second-level interconnect L2 or inlaid third-level interconnect L3 has, at the upper corner thereof, a round taper. This makes it possible to relax an electric field applied to a portion of the main conductor film 18a or 18b corresponding to its upper corner (in the vicinity of the conductive barrier film 17a or 17b). Based on the investigation of the present inventors, a ratio of an electric field E1 of a portion corresponding to the upper corner of the main conductor film 18a or 18b to an electric field E2 of the upper corner portion of the conductive barrier film 17a or 17b can be controlled to 1:2. In other words, the electric field intensity of a portion corresponding to the upper corner of the main conductor film 18a or 18b can be reduced to half of the electric field intensity of the upper corner of the conductive barrier film 17a or 17b. In addition, the main conductor film 18a or 18b made of copper having a high diffusion coefficient can be kept at a distance from the CMP surface (second surface) of the insulating film 12b or 12d in which a leak path tends to be formed. This makes it possible to suppress or prevent formation of a leak path between the two adjacent inlaid second-level interconnects L2, L2 or two adjacent inlaid third-level interconnects L3, L3. As a result, the TDDB life can be improved.

(Embodiment 2)

Figure 19:
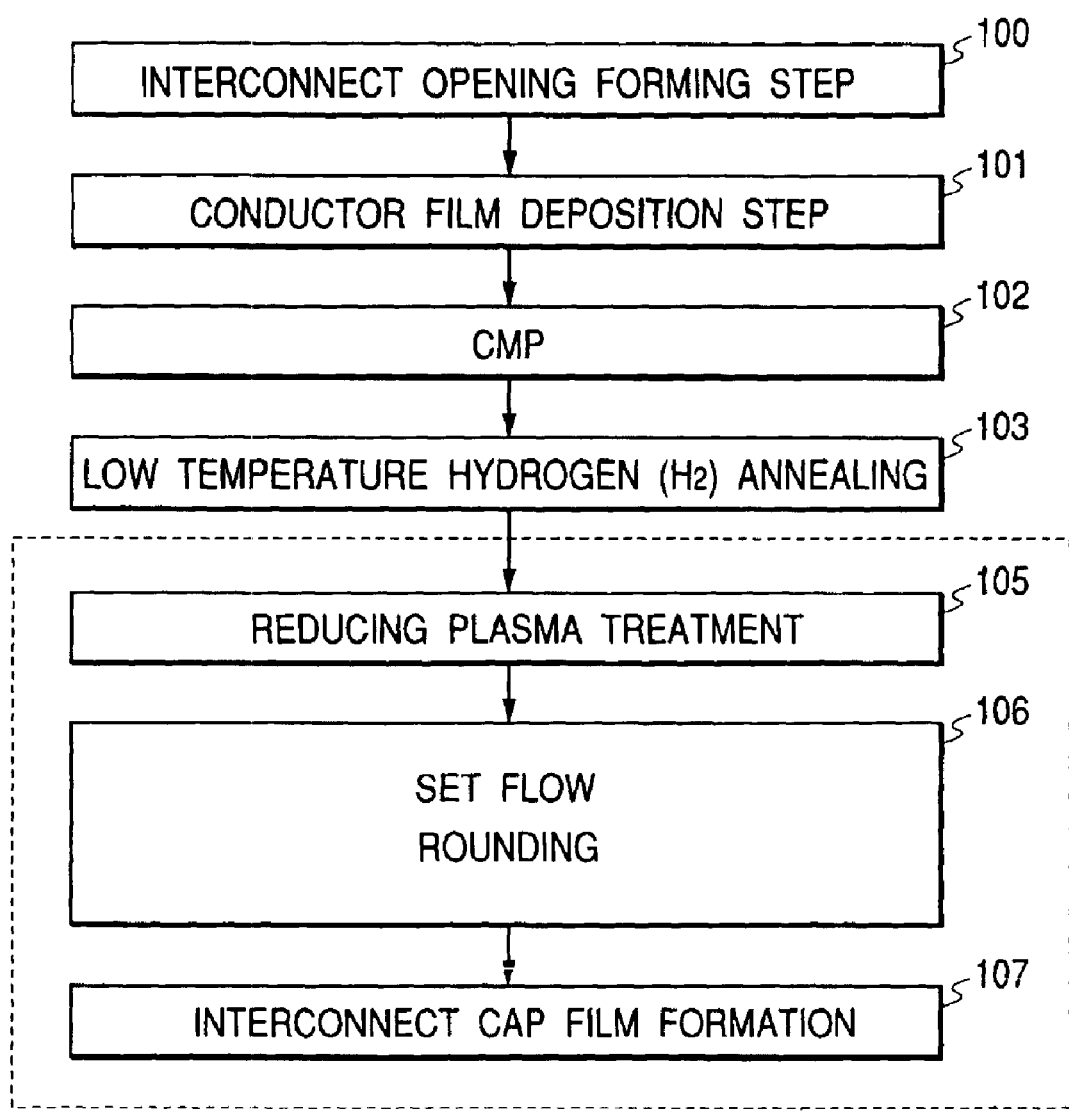
FIG. 19 is a flowchart of the manufacturing step of a semiconductor device according to another embodiment of the present invention.

FIG. 19 is a flowchart of the manufacturing step of the semiconductor device according to another embodiment of the present invention. In this Embodiment 2, as illustrated in FIG. 19, the round taper of the main conductor film of the inlaid interconnect is formed in the set flow step 106. Described specifically, when the interconnect capping insulating film is made of a silicon nitride film, a silicon carbide film, an SiCN film or a silicon oxynitride film, a carrier gas such as nitrogen or helium is fed prior to feeding of a treatment gas upon set flow. While the time from the starting of feeding with the carrier gas until the starting of feeding with the treatment gas is set longer than that of the ordinary set flow, annealing is conducted during the introduction term of only the carrier gas, and stage temperature is set at a temperature as described in Embodiment 1, the wafer 1W is subjected to annealing treatment similar to that described in the round formation step of Embodiment 1, whereby a round taper is formed at the upper corner of the main conductor film 18a or 18b of the inlaid interconnect. In this case, a round taper forming step is not added so that simplification of the manufacturing process and shortening of the manufacturing time can be promoted. This embodiment is similar to Embodiment 1 except the above-described step.

(Embodiment 3)

Figure 20:
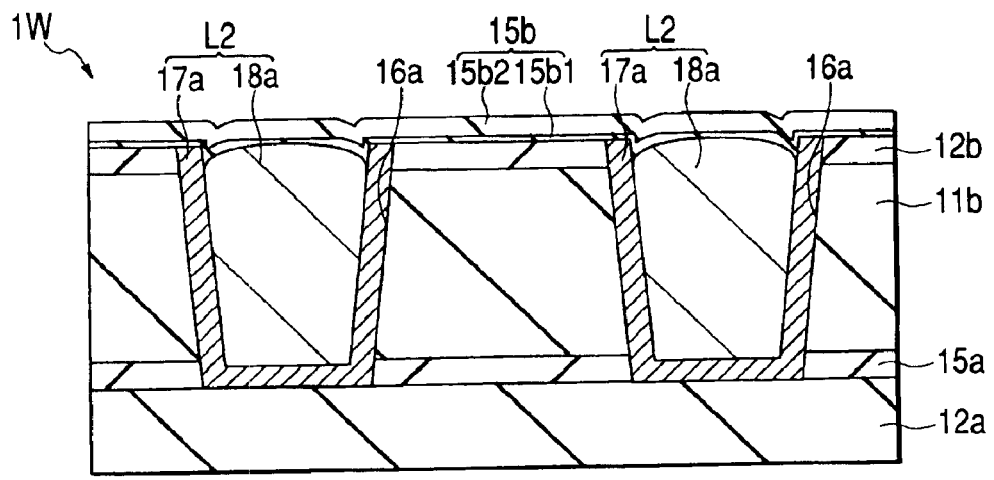
FIG. 20 is a fragmentary cross-sectional view of a semiconductor substrate during the manufacturing step according to a further embodiment of the present invention.

In Embodiment 3, a description will be made on the formation of an interconnect capping insulating film as a multilevel film. The insulating film is formed as a multilevel film in order to dissolve the problem discovered for the first time by the present inventor that when an SiON film such as the above-described "PE-TMS" (product of Canon) is employed as an interconnect capping insulating film, the conductive barrier film is inevitably oxidized upon formation of the insulating film. FIG. 20 is a fragmentary cross-sectional view of a semiconductor device, during its manufacturing process, according to a further embodiment of the present invention.

Upon deposition of an interconnect capping insulating film (second insulating film) 15b by CVD over the upper surface of the inlaid second-level interconnect L2 and insulating film 12b after the above-described ammonia plasma treatment without release of the chamber to the air, the insulating film 15b is deposited in order to prevent the oxidation of the exposed portion of the conductive barrier film 17a of the inlaid second-level interconnect L2. For this purpose, continuously after deposition, over the insulating film 12b and inlaid second-level interconnect L2, an oxidation barrier insulating film (third insulating film) 15b1 for suppressing or preventing oxidation of the conductive barrier film 17a, that is, for protecting it from oxidation, an insulating film (fourth insulating film) 15b2 made of silicon oxynitride (SiON), for example, "PE-TMS" (product of Canon, dielectric constant: 3.9) is deposited over the insulating film 15b1 by plasma CVD using a gas mixture of a trimethoxysilane (TMS, chemical formula: $SiH(OCH_3)_2$) gas and a nitrogen oxide ($N_2O$) gas while maintaining the vacuum state without releasing the chamber to the air. By this insulating film, the oxidation of the conductive barrier film 17a can be suppressed or prevented upon deposition of the silicon oxynitride (SiON) film. This makes it possible to suppress or prevent unfavorable copper diffusion in the main conductor film 18a which will otherwise occur owing to the oxidation of the conductive barrier film 17a, thereby improving the TDDB life. Moreover, the most part or the whole part of the interconnect capping insulating film 15b is formed from a material having a dielectric constant lower than that of a silicon nitride film so that an interconnect capacitance can be reduced, thereby improving the operation speed of the semiconductor device. Furthermore, PE-TMS having excellent moisture resistance is usable as an interconnect capping insulating film of the inlaid-second-level interconnect so that the reliability of the semiconductor device can be improved. Such an antioxidant film can be formed in the following manner.

The first method is to form an oxidation barrier insulating film 15b1, for example, from an insulating film having an inhibitory or preventive function of copper diffusion, such as a silicon nitride (SiC) film, silicon carbide (SICN) film or a silicon carbonitride film. The oxidation barrier insulating film 15b1 has a thickness of, for example, 1 nm or greater and it is formed thinner than the insulating film 15b2 because lowering of the whole dielectric constant of the interconnect structure is desired. The insulating film 15b2 has a thickness of about 50 nm or less. A nitrogen content of the insulating film 15b2 is about 1 to 8%. The pressure in the chamber upon formation of the insulating film 15b2 is, for example, about 0.5 to 1.0 Torr (=66.6612 to 133.332 Pa), the flow rate of a trimethoxysilane gas is, for example, about 100 to 150 $cm^3$/min, the flow rate of an $N_2O$ gas is, for example, 4000 $cm^3$/min or less, the power applied to the upper or lower electrode of the plasma-enhanced CVD system is, for example, about 500 to 1000W. Use of a silicon carbide or silicon carbonitride film as the oxidation barrier insulating film 15b1 makes it possible to reduce a dielectric constant as compared with that of the insulating film 15b1 formed from a silicon nitride film, thereby lowering an interconnect capacitance. As a result, the operation speed of the semiconductor device can be improved.

The second method is to form the oxidation barrier insulating film 15b1 from a silicon oxynitride (SiON) film such as "PE-TMS" (product of Canon, dielectric constant: 3.9) deposited by plasma-enhanced CVD under oxygen-free gas conditions, particularly, under conditions free from an $N_2O$ gas having a high oxidizing property. Also in this case, the insulating film 15b1 has a suppressive or preventive function of copper diffusion.

Under oxygen-free gas conditions, a gas mixture of a trimethoxysilane (TMS) gas and an ammonia ($NH_3$) gas or a trimethoxysilane (TMS) gas and a nitrogen ($N_2$) gas is usable. In this case, the oxidation barrier insulating film 15b1 has a thickness of about 1 to 10 nm. The insulating film 15b2 lying thereover has a thickness as described in the first step. A nitrogen content in the insulating film 15b1 or 15b2 is for example about 1 to 8%. The pressure in the chamber upon formation of the insulating film 15b1 is, for example, about 0.5 to 1.0 Torr (=66.6612 to 133.332 Pa), the flow rate of a trimethoxysilane gas is, for example, about 100 to 150 $cm^3$/min, the flow rate of an $N_2O$ gas is, for example, 0 $cm^3$/min or less, the flow rate of an $N_2$ gas, if it is used, is, for example, about 4000 $cm^3$/min or less, the flow rate of an $NH_3$ gas, if it is used, is for example about 1500 $cm^3$/min, the power applied to the upper or lower electrode of the plasma-enhanced CVD system is similar to that of the first method. The film forming conditions of the insulating film 15b2 are similar to those described in the first method. Since in this second method, both the insulating films 15b1,15b2 can be formed from a silicon oxynitride film, such as "PE-TMS" having a low dielectric constant, this second method can reduce an interconnect capacitance and improve the operation speed of a semiconductor device compared with the first method. Moreover, by forming the whole insulating film 15b (insulating films 15b1 and 15b2) from a silicon oxynitride film such as "PE-TMS" excellent in moisture resistance, the reliability of the semiconductor device can be improved.

The third method is to form the oxidation barrier insulating film 15b1 from a silicon oxynitride film such as the above-described "PE-TMS" deposited by plasma CVD using, upon film formation, a gas containing $N_2/O_2$ having a low oxidizing property and being reduced in the content of oxygen (particularly $N_2O$ having a high oxidizing property). Also in this case, the insulating film 15b1 has a function of suppressing or preventing copper diffusion. To reduce the oxygen content to satisfy the above-described condition, a mixture of trimethoxysilane gas, $N_2$ gas and $O_2$ gas, a mixture of trimethoxysilane gas, $NH_3$ gas and $O_2$ gas, and a mixture of trimethoxysilane gas, $NH_3$ gas, $N_2O$ gas and $O_2$ gas, or a gas mixture of trimethoxysilane gas, $N_2O$ gas and $NH_3$ gas is usable. In this case, the $N_2$ gas or $NH_3$ gas serves as a diluting gas in a gas mixture.

The thickness and nitrogen content of the insulating films 15b1 and 15b2 are similar to those as described in the second method. The pressure in the chamber upon formation of the insulating film 15b1, and powers applied to the upper electrode and lower electrode of the plasma-enhanced CVD system are similar to those described in the first or second method. When a mixture of a trimethoxysilane gas, $N_2$ gas and $O_2$ gas is used as the treatment gas upon film formation, the flow rates of the trimethoxysilane gas, $N_2$ gas, and $O_2$ gas are, for example, about 75 to 150 $cm^3/min$, about 4000 $cm^3/min$ or less and about 4000 $cm^3/min$ or less, respectively. When a mixture of a trimethoxysilane gas, $NH_3$ gas and $O_2$ gas is used, the flow rates of the trimethoxysilane gas, $NH_3$ gas, and $O_2$ gas are, for example, about 75 to 150 $cm^3/min$, about 1500 $cm^3/min$ and about 4000 $cm^3/min$, respectively. When a mixture of a trimethoxysilane gas, $NH_3$ gas, $N_2$ gas and $O_2$ gas is used, the flow rates of the trimethoxysilane gas, $NH_3$ gas, $N_2$ gas, and $O_2$ gas are about 75 to 150 $cm^3/min$, about 1500 $cm^3/min$ or less, about 4000 $cm^3/min$, and about 4000 $cm^3/min$, respectively. When a mixture of a trimethoxysilane gas, $N_2O$ gas and $NH_3$ gas is used, the flow rates of the trimethoxysilane gas, $N_2O$ gas, and $NH_3$ gas are, for example, about 75 to 150 $cm^3/min$, about 4000 $cm^3/min$, and about 1500 $cm^3/min$, respectively. The conditions of forming the insulating film 15b2 are similar to those of the first or second method. As one application of this third method, the whole insulating film 15b may be formed by the third method. Described specifically, the whole insulating film 15b may be formed from a film composed solely of a silicon oxynitride film deposited by the plasma-enhanced CVD under the oxygen-reduced gas conditions. In this case, the insulation capping insulating film can be formed easily and film formation time can be shortened because change of the kind of a gas and control therefor are not required.

In the above description, a trimethoxysilane gas was employed for the formation of a silicon oxynitride film (SiON, nitrogen content: about 1 to 8%). The gas is not limited to it but another gas can be employed. For the formation of the insulating film 15b2 in the first method or the insulating films 15b1,15b2 in the second method, a mixture of a gas selected from monosilane, disilane and TEOS, an ammonia gas and an oxygen gas (or $N_2O$ or ozone ($O_3$)), or this gas mixture having nitrogen introduced therein may be employed. Alternatively, usable is a mixture of a gas selected from a trimethylsilane (3MS) gas and a tetramethylsilane (4MS) gas, and a nitrogen oxide ($N_2O$) gas (or a nitrogen oxide gas and an ammonia ($NH_3$) gas) or this gas mixture having, added thereto, a nitrogen ($N_2$) gas, a mixture of a nitrogen ($N_2$) gas and an oxygen ($O_2$) gas, or a mixture of a nitrogen gas, an oxygen gas and an ammonia gas. In such a case, since oxidation of the exposed portion of the conductive barrier film 17a can be suppressed or prevented, copper diffusion can be suppressed or prevented, leading to an improvement in the TDDB life. The oxidation of a conductive barrier film and a countermeasure against this problem are disclosed in Japanese Patent Application No. 2001-341339 (filed on Nov. 7, 2001) applied by the inventors of the present application.

(Embodiment 4)

Figure 21:
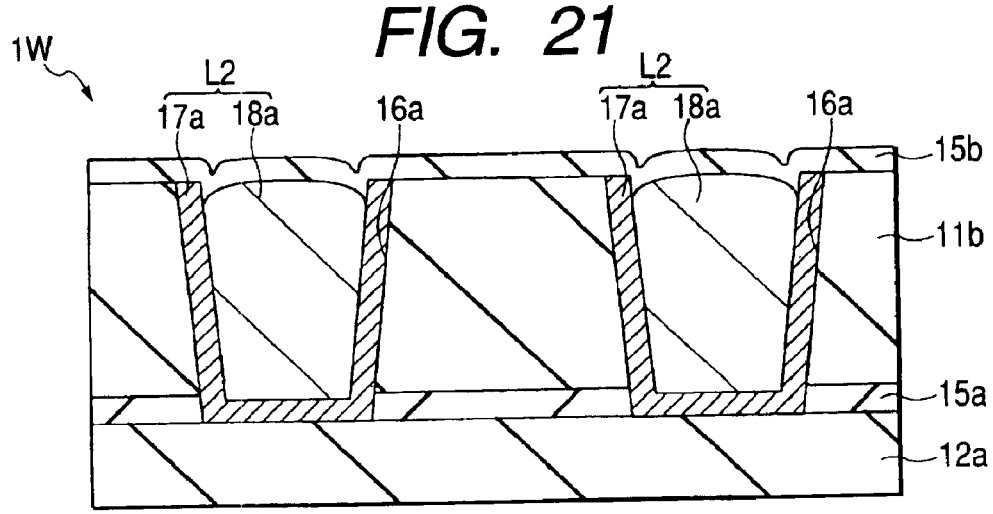
FIG. 21 is a fragmentary cross-sectional view of a semiconductor substrate during the manufacturing step according to a still further embodiment of the present invention.

In Embodiment 4, an insulation capping insulating film as described in Embodiment 1 is not disposed. FIG. 21 is a fragmentary cross-sectional view of a semiconductor device during its manufacturing step according to a further embodiment of the present invention. Over the upper surface (CMP surface, second surface) of the insulating film 11b made of a Low-K material, an interconnect capping insulating film 15b is directly deposited without an insulation capping insulating film. The interconnect capping insulating film 15b may have a multilevel structure as in Embodiment 3. In this Embodiment 4, as well as an improvement in the TDDB life, a reduction in an interconnect capacitance can be attained, because no insulation capping insulating film is disposed. As a result, the operation speed of the semiconductor device can be improved.

(Embodiment 5)

Figure 22:
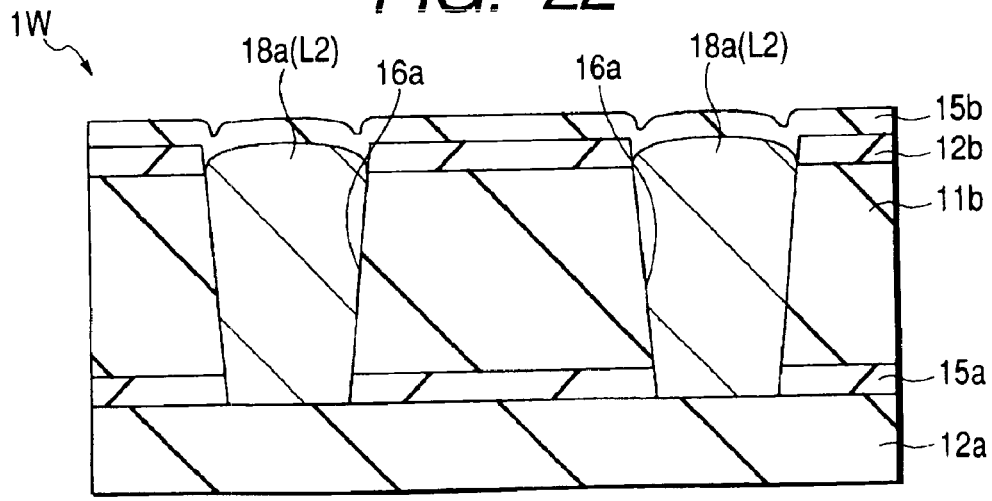
FIG. 22 is a fragmentary cross-sectional view of a semiconductor substrate during the manufacturing step according to a still further embodiment of the present invention.

In Embodiment 5, an inlaid interconnect structure from which a conductive barrier film is eliminated (barrierless inlaid interconnect structure) is described. FIG. 22 is a fragmentary cross-sectional view of a semiconductor device during its fabrication step according to a still further embodiment of the present invention. The main conductor film 18a composed of copper is in direct contact with the insulating films 11b,12a,12b,15a in the interconnect trench 16a. Also in Embodiment 5, an insulation capping insulating film may be omitted as in Embodiment 4. According to Embodiment 5, an interconnect resistance of the inlaid second-level interconnect L2 can be drastically decreased. Moreover, interconnects of different levels can be connected directly without a conductive barrier film so that the contact resistance between these different-level interconnects can be reduced considerably and resistance at minute through-holes can be reduced. Accordingly, even if the interconnect trench 16 or through-hole 9 are miniaturized, the performance of the semiconductor device can be improved. As a result, miniaturization of interconnects constituting the semiconductor device can be promoted.

In Embodiment 5, a round taper is formed at an upper corner of the main conductor film 18a, and the upper corner of the main conductor film 18a made of copper is disposed apart from the upper surface (CMP surface, second surface) of the insulating film 12b adjacent thereto. As in Embodiments 1 to 4, these features make it possible to suppress or prevent formation of a leak path in the two adjacent inlaid second-level interconnects L2, L3, thereby improving the TDDB life. Such a barrierless inlaid interconnect structure is disclosed, for example, in Japanese Patent Application No. 2000-104015, 2000-300853 or 2001-131941 (filed on Apr. 27, 2001).

(Embodiment 6)

In Embodiment 6, the inlaid interconnect as described above is used property for each of the interconnect layers. In the interconnect layers of a semiconductor device, the distance between two adjacent interconnects tend to be narrower at the lower interconnect layers near minute elements formed over the substrate and this tendency seems to be accelerated in future. In such a case, a deterioration in the TDDB life due to copper diffusion is apt to become obvious. The distance between two adjacent interconnects is relatively wide at the upper interconnect layers which are relatively apart from the above-described elements and there is a certain degree of a margin for the deterioration of the TDDB life due to copper diffusion. In the manufacturing process of a semiconductor device, an increase in the number of steps, addition of a heat treatment step or addition of a step to cause step difference is not desired so there are process-wise limitations.

Figure 23:
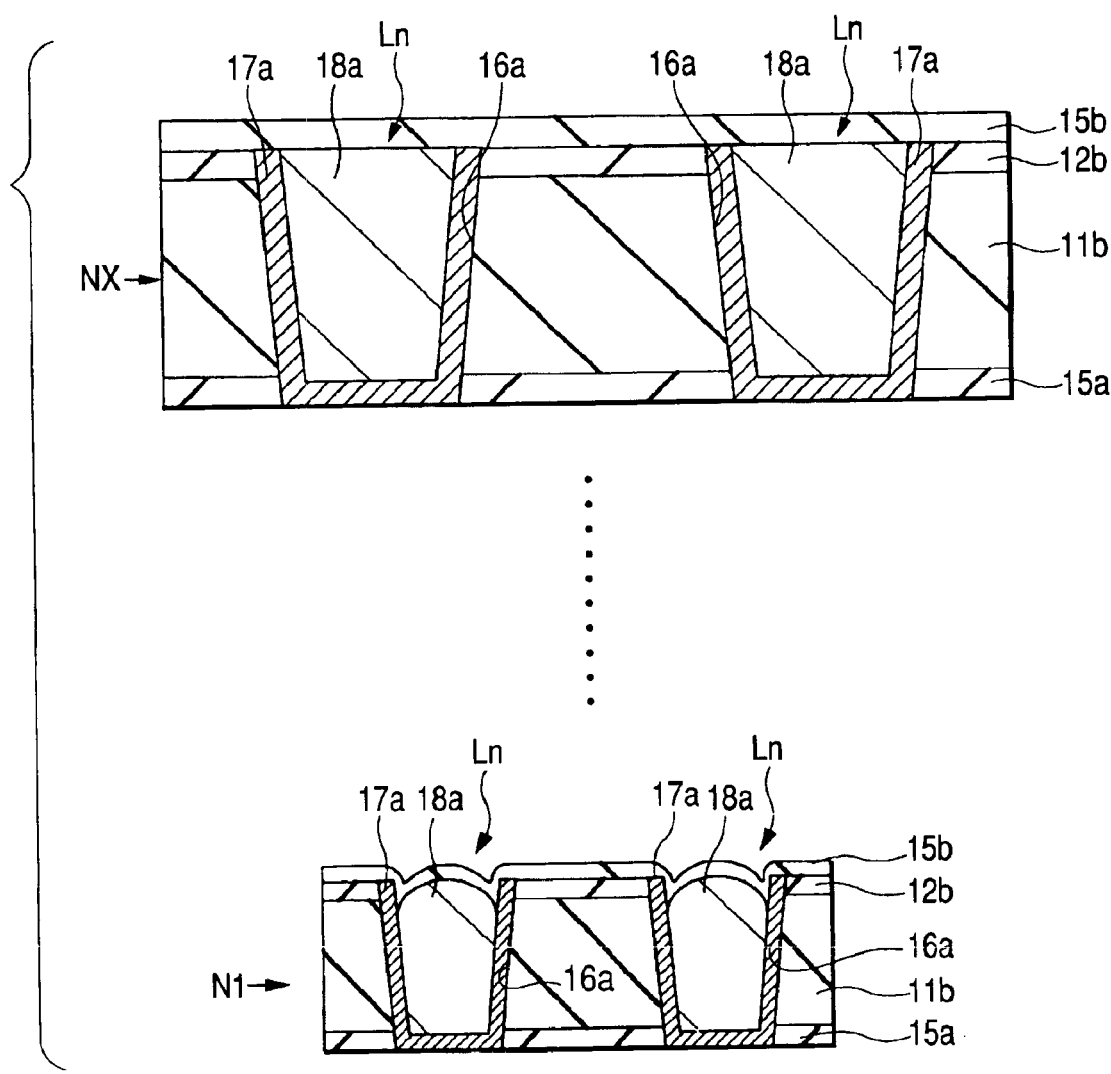
FIG. 23 is a fragmentary cross-sectional view schematically illustrating a semiconductor device according to a still further embodiment of the present invention.

In this Embodiment 6, therefore, an inlaid interconnect structure as described in Embodiment 1 is adopted for a lower interconnect layer having a small margin, while an ordinarily employed inlaid interconnect structure is applied to the upper interconnect layer having a large margin. FIG. 23 is a fragmentary cross-sectional view which schematically illustrates the semiconductor device of Embodiment 6. An interconnect layer N1 is, for example, a lower interconnect layer such as first-level or second-level interconnect layer which is relatively small in the interconnect width or distance between interconnects, while an interconnect layer Nx is, for example, an upper interconnect layer such as fifth-level or sixth-level interconnect layer which is relatively large in the interconnect width or distance between interconnects. As an explanation is made with the 0.13 micron generation as an example, the interconnect width and interconnect-to-interconnect distance of an inlaid interconnect (interconnect) are, for example, about 0.18 $\mu$m, supposing that the interconnect layer N1 is the first-level interconnect layer, while those of an inlaid interconnect (interconnect) are, for example, about 0.36 $\mu$m, supposing that the interconnect layer Nx is the fifth-level interconnect layer. As an explanation is made with the 0.1 micron generation as an example, the interconnect width and interconnect-to-interconnect distance of an inlaid interconnect (interconnect) are, for example, about 0.14 $\mu$m, supposing that the interconnect layer N1 is the first-level interconnect layer, while those of an inlaid interconnect (interconnect) are, for example, about 0.28 $\mu$m, supposing that the interconnect layer Nx is the fifth-level interconnect layer In FIG. 23, the inlaid interconnect Ln of the lower interconnect layer N1 is formed to have a similar structure to that of Embodiment 1, that is, to have a round taper formed at an upper corner of the main conductor film 18a. The inlaid interconnect Ln of an upper interconnect layer Nn is, on the other hand, formed to have an ordinarily employed structure. Described specifically, no taper is formed at an upper corner of the main conductor film 18a and the upper surface (first surface) level of the main conductor film 18a almost coincides with the upper surface (MP surface, second surface) level of the insulating film 12b. The above-described structure contributes to an improvement in the TDDB life. Furthermore, since the process-wise limitations are satisfied, a highly reliable semiconductor device on the whole can be provided.

(Embodiment 7)

Figure 24:
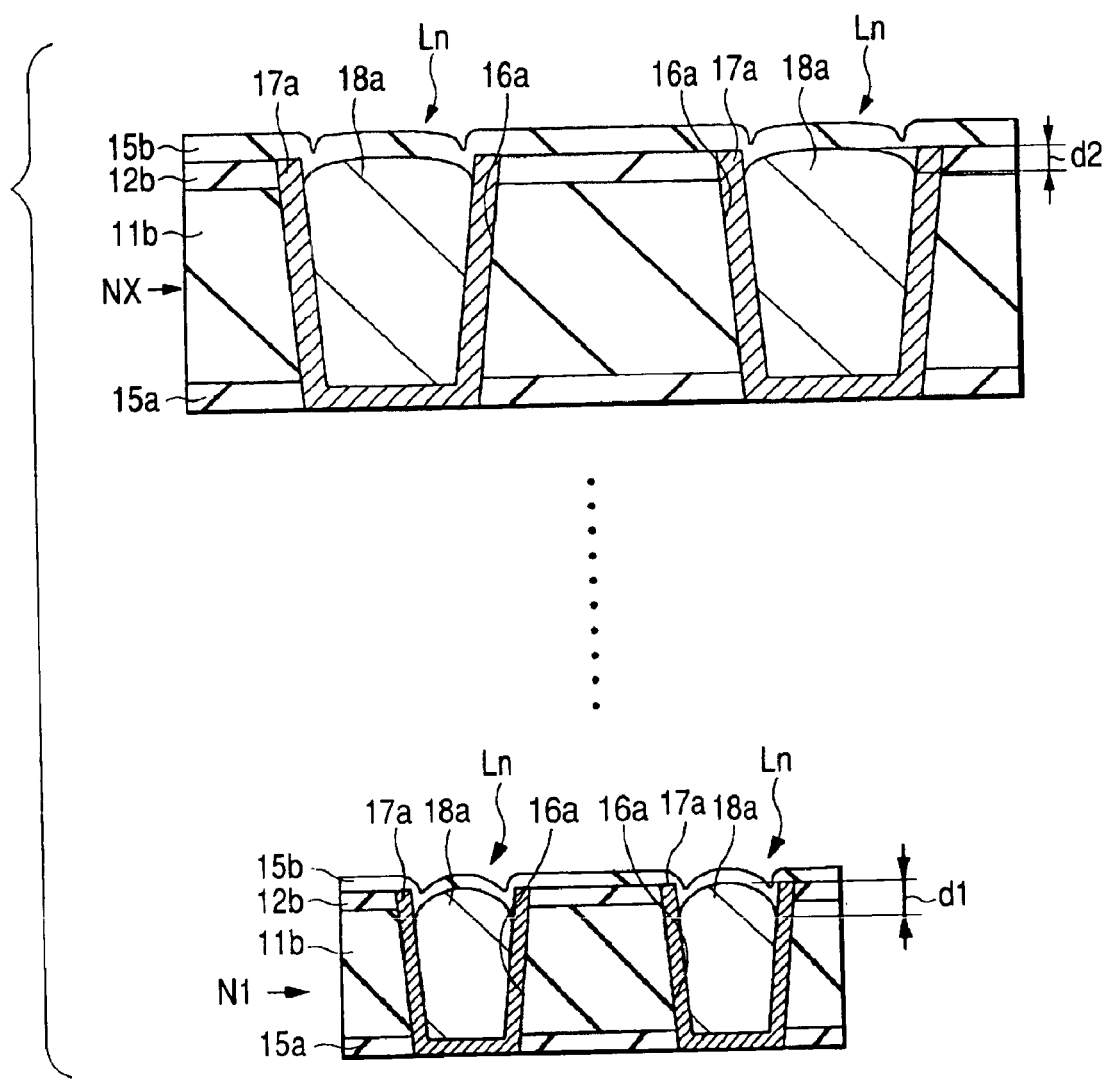
FIG. 24 is a fragmentary cross-sectional view schematically illustrating a semiconductor device according to a still further embodiment of the present invention.

In Embodiment 7, described is a technique of changing the round taper state of an inlaid interconnect according to interconnect layers. FIG. 24 is a fragmentary cross-sectional view schematically illustrating the semiconductor device of Embodiment 7. In this Embodiment 7, all the inlaid interconnects Ln of the lower interconnect layer N1 and upper interconnect layer Nx are formed to have a similar structure as Embodiment 1, that is, to have a round taper at an upper corner of the main conductor film 18a except that the depth d1 of the round taper of the main conductor film 18a of the lower inlaid interconnect Ln is formed deeper than the depth d2 of the round taper of the main conductor film 18a of the upper inlaid interconnect Ln. In other words, the round taper of an upper corner of the main conductor film 18a is greater in the inlaid interconnect Ln of the lower interconnect layer N1. This structure is formed because, as described in Embodiment 6, the distance between two adjacent interconnects of the lower interconnect layer is narrow so that lowering in the TDDB life due to copper diffusion tends to appear, while the distance between two adjacent interconnects of the upper interconnect layer is wide and has a margin relatively. The reliability of the semiconductor device can be improved on the whole by extending the TDDB life by increasing the size of a round taper of the main conductor film 18a in the inlaid interconnect Ln of the lower interconnect layer N1 in which copper diffusion tends to cause a problem; and by satisfying the process-wise limitations by decreasing the size of a round taper of the main conductor film 18a in the inlaid interconnect Ln of the upper interconnect layer Nx which has a margin.

(Embodiment 8)

Figure 25:
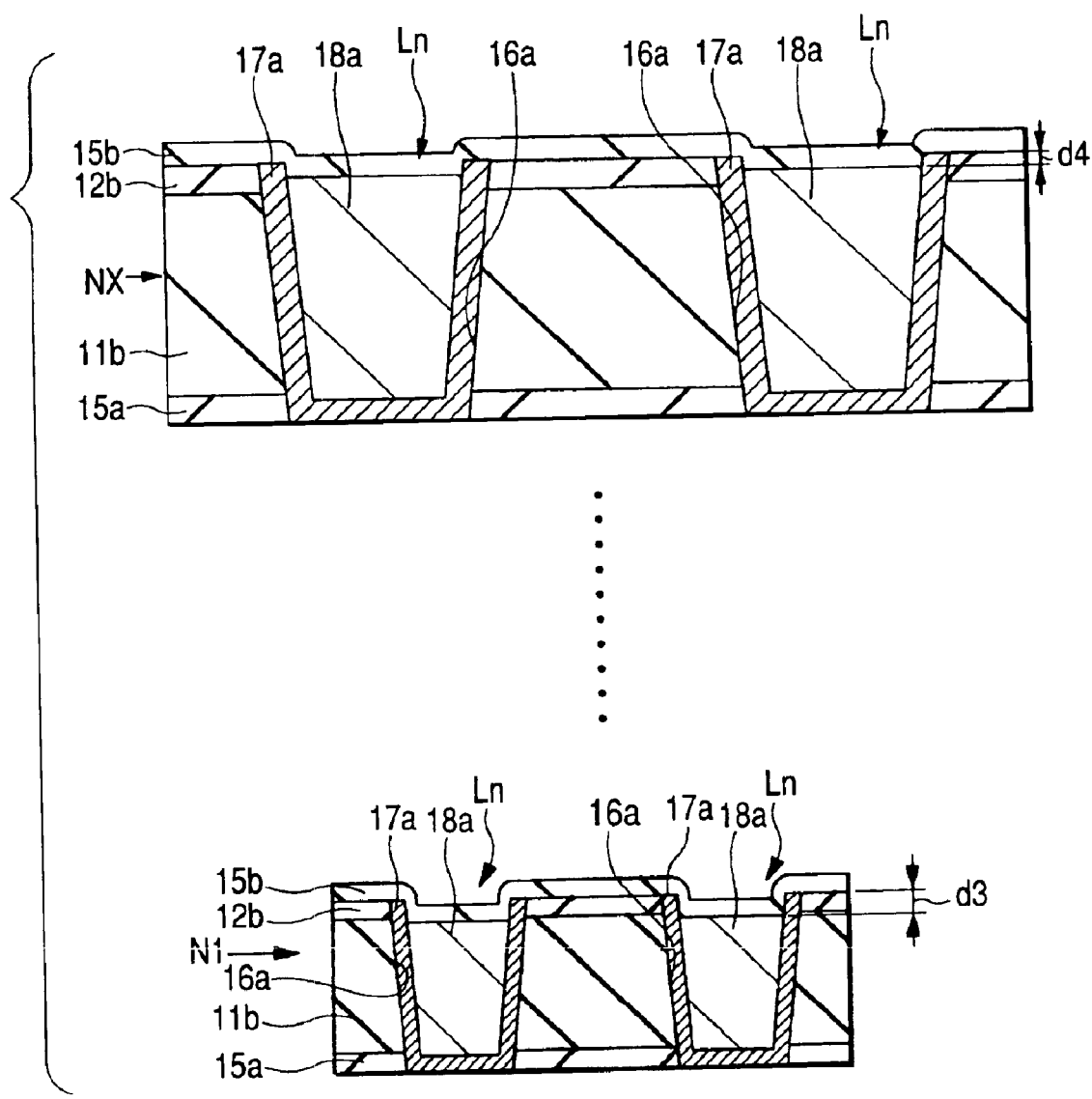
FIG. 25 is a fragmentary cross-sectional view schematically illustrating a semiconductor device according to a still further embodiment of the present invention.

In Embodiment 8, described is a technique of changing a step difference state of inlaid interconnects according to interconnect layers. FIG. 25 is a fragmentary cross-sectional view schematically illustrating the semiconductor device of Embodiment 8. In Embodiment 8, the upper surface (first surface) level of the main conductor film 18 in the inlaid interconnect Ln of the lower interconnect layer N1 and upper interconnect layer Nx is formed lower than the upper surface (CMP surface, second surface) levels of the conductive barrier film 17a and insulating film 12b. By this structure, the distance between the main conductor film 18a and the CMP surface and also the distance between the corner of the main conductor film 18a and the site of the corner (corner of the conductive barrier film 17a) of the interconnect layer Ln on which an electric field concentration occurs become greater, which suppresses or prevents the formation of a leak path, thereby improving the TDDB life.

Such a technique of forming a step difference on the upper surface of the main conductor film 18a of the inlaid interconnect Ln is disclosed in Japanese Patent Application No. 2001-131941 (filed on Apr. 27, 2001) by the inventors of the present application. In Embodiment 8, however, the step difference d3 of the main conductor film 18a in a lower inlaid interconnect Ln is formed greater than the step difference d4 of the main conductor film 18a of an upper inlaid interconnect layer Ln because of the same reasons as described in Embodiment 6 or 7. According to this Embodiment 8, therefore, by forming a relatively large step difference on the upper surface of the main conductor film 18a in the inlaid interconnect Ln of a lower interconnect layer N1 in which copper diffusion tends to be a problem, the TDDB life can be improved, while by forming a relatively small step difference on the upper surface of the main conductor film 18a in the inlaid interconnect Ln of an upper interconnect layer Nx which has a margin, thereby suppressing or preventing occurrence of inconveniences due to the step difference, thus satisfying the process-wise limitations, the reliability of the semiconductor device can be improved on the whole.

As a modification example of Embodiment 8, the inlaid interconnect Ln of a lower interconnect layer N1 may be formed as an inlaid interconnect structure as described in Embodiment 1 or the like and the inlaid interconnect Ln of an upper interconnect layer Nx may be formed as illustrated in FIG. 25. As another modification example, the inlaid interconnect Ln of a lower interconnect layer N1 may be formed as illustrated in FIG. 25 and the inlaid interconnect Ln of an upper interconnect layer Nx may be formed to have a structure as described in Embodiment 1 or the like or an ordinary structure employed in an upper interconnect layer Nx as illustrated in FIG. 23.

(Embodiment 9)

Figure 26:
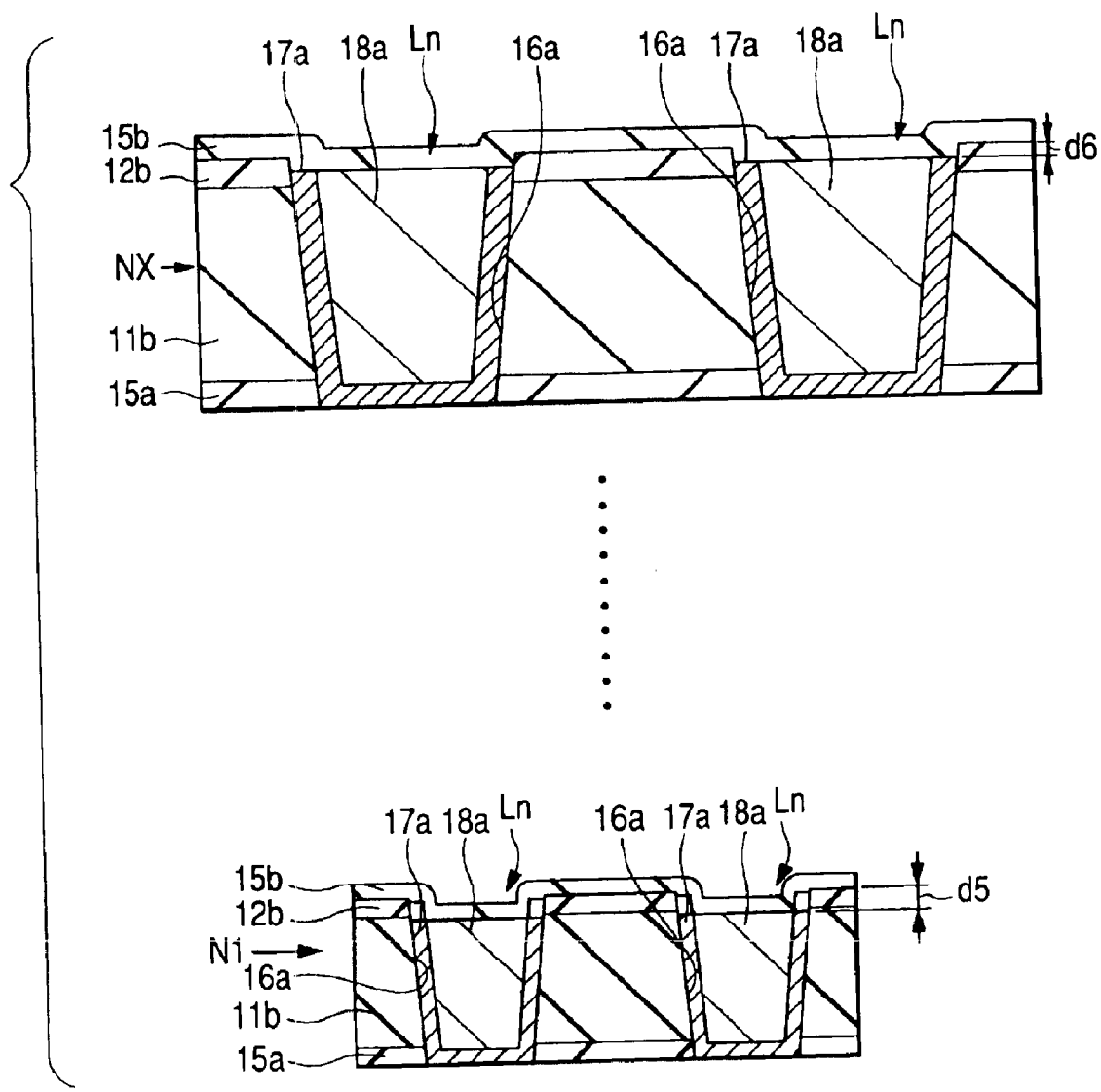
FIG. 26 is a fragmentary cross-sectional view schematically illustrating a semiconductor device according to a still further embodiment of the present invention.

In Embodiment 9, another technique of changing the step difference state according to an interconnect layer is described. FIG. 26 is a fragmentary cross-sectional view schematically illustrating a semiconductor device of Embodiment 9. In this Embodiment 9, the upper surface (first surface) level of each of the main conductor film 18a and conductive barrier film 17a in the inlaid interconnect Ln of a lower interconnect layer N1 or an upper interconnect layer Nx is formed lower than the upper surface (CMP surface, second surface) level of the insulating film 12b. The above-described structure in which the main conductor film 18a is kept apart from the CMP surface can suppress or prevent the formation of a leak path, thereby improving the TDDB life.

Also a technique of having a step difference on the upper surface of an interconnect Ln is disclosed in Japanese Patent Application No. 2001-131941 (filed on Apr. 27, 2001) by the inventors of the present application. In this Embodiment, however, the step difference d5 of the main conductor film 18a in the inlaid interconnect Ln of a lower interconnect layer N1 is formed greater than the step difference d6 of the main conductor film 18a in the inlaid interconnect Ln of an upper interconnect layer Nx because of the same reasons as described in Embodiments 6 to 8. According to Embodiment 9, by forming a relatively large step difference on the upper surface of the main conductor film 18a in the inlaid interconnect Ln of a lower interconnect layer N1 in which copper diffusion tends to cause a problem, the TDDB life can be improved. On the other hand, by forming a relatively small step difference on the upper surface of the main conductor film 18a in the inlaid interconnect Ln of an upper interconnect layer Nx which has a margin, thereby suppressing or preventing occurrence of inconveniences due to the step difference, thus satisfying the process-wise limitations, the reliability of the semiconductor device can be improved on the whole.

As a modification example of Embodiment 9, the inlaid interconnect Ln of a lower interconnect layer N1 may be formed as an inlaid interconnect structure as described in Embodiment 1 or the like and the inlaid interconnect Ln of an upper interconnect layer Nx may be formed as illustrated in FIG. 26. As another modification example, the inlaid interconnect Ln of a lower interconnect layer N1 may be formed as illustrated in FIG. 26 and the inlaid interconnect Ln of an upper interconnect layer Nx may be formed as an inlaid interconnect structure as described in Embodiment 1 or the like or an ordinary inlaid interconnect structure employed in the upper interconnect layer Nx of FIG. 23.

(Embodiment 10)

Figure 27:
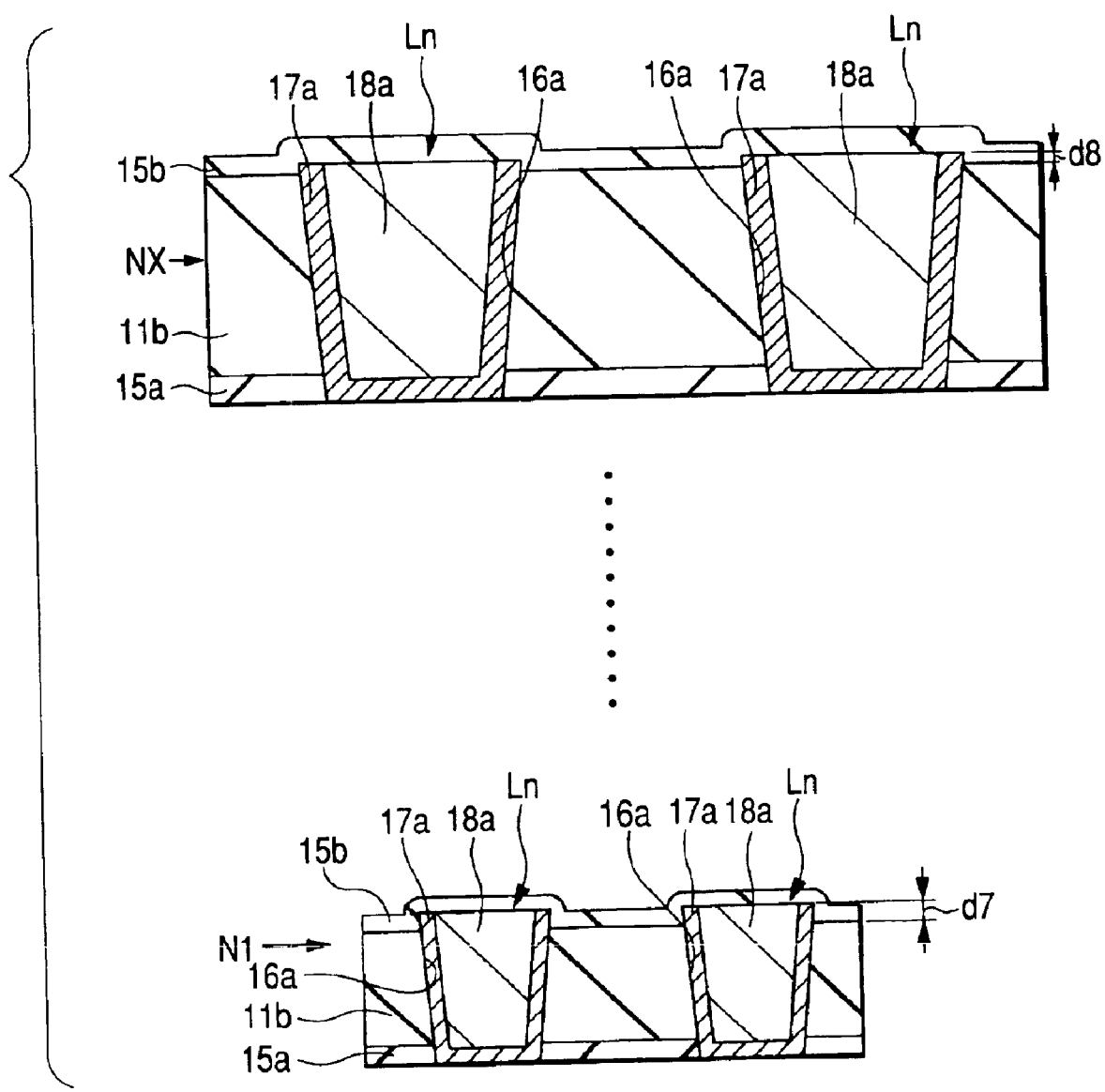
FIG. 27 is a fragmentary cross-sectional view schematically illustrating a semiconductor device according to a still further embodiment of the present invention.

In this Embodiment 10, a description will next be made of a further technique of changing the step difference state of an inlaid interconnect according to the position of an interconnect layer. FIG. 27 is a fragmentary cross-sectional view schematically illustrating a semiconductor device of Embodiment 10. In Embodiment 10, the upper surface level (CMP surface, first surface) of each of the main conductor film 18a and conductive barrier film 17a of the inlaid interconnect Ln of a lower interconnect layer N1 and an upper interconnect layer Nx is protruded relative to the upper surface (second surface) of the insulating film 12b. Such a structure makes it possible to keep the main conductor film 18a away from the CMP surface, thereby suppressing or preventing the formation of a leak path. As a result, the TDDB life can be improved. In this case, as a structure free of an insulation capping insulating film, the above-described step difference can be formed by removing the upper surface of the insulating film 11b by etching upon the above-described reducing plasma treatment so that the manufacturing process can be simplified.

Such a technique of forming a step difference on the upper surface of an inlaid interconnect Ln is, for example, disclosed in Japanese Patent Application No. 2001-131941 (filed on Apr. 27, 2001) by the inventors of the present invention. In this Embodiment 10, because of similar reasons to those as described in Embodiments 6 to 9, the protruding step difference d7 of the inlaid interconnect Ln of a lower interconnect layer N1 is formed greater than the protruding step difference d8 in the inlaid interconnect Ln of an upper interconnect layer Nx. By forming a relatively large protruding step difference on the upper surface of the inlaid interconnect Ln of a lower interconnect layer N1 in which copper diffusion tends to pose a problem, the TDDB life can be improved, while by forming a relatively small protruding step difference on the upper surface of the inlaid interconnect Ln of an upper interconnect layer Nx which has a margin, thereby suppressing or preventing generation of inconveniences due to the step difference, thus satisfying the process-wise limitations, the reliability of the semiconductor device can be improved on the whole.

As a modification example of Embodiment 10, the inlaid interconnect Ln of a lower interconnect layer N1 may be formed as an inlaid interconnect structure as described in Embodiment 1, 8 or 9 and an inlaid interconnect Ln of an upper interconnect layer Nx may be formed as illustrated in FIG. 27. As another modification example, the inlaid interconnect Ln of a lower interconnect layer N1 may be formed as illustrated in FIG. 27 and the inlaid interconnect Ln of an upper interconnect layer Nx may be formed as an inlaid interconnect structure as described in Embodiment 1, 8 or 9 or an ordinary inlaid interconnect structure employed in an upper interconnect layer Nx of FIG. 23.

The present invention made by the present inventors was described specifically by some embodiments. It should however be borne in mind that the present invention is not limited to or by them, but can be changed within an extent not departing from the scope of the invention.

In Embodiments 1 to 10, a description was given of the formation of a capping film continuously after post treatment (plasma treatment) without vacuum break. Alternatively, vacuum break may be conducted once after post treatment, followed by the formation of the capping film. The present invention more effectively exhibits its advantages in the former case, but a thin nitride layer formed by the post ammonia plasma treatment can suppress the formation of an oxide layer even if a wafer is exposed to atmosphere after vacuum break. As a result, some advantages of the present invention can be offered even after vacuum break.

A method of forming a round taper on the main conductor film in an inlaid interconnect is not limited to those described in Embodiments 1 to 10, but can be modified. For example, a round taper may be formed at an upper corner of the main conductor film in an inlaid interconnect by maintaining the inside of the chamber in a plasma-enhanced CVD system under vacuum condition and heat treating the wafer without feeding a gas to the chamber.

In the above Embodiments, a round taper was formed on the upper surface of an inlaid interconnect in a film forming apparatus used for the formation of an insulation capping insulating film. Alternatively, the round taper may be formed on the upper surface of an inlaid interconnect by heat treatment in a hydrogen gas atmosphere or a nitrogen gas atmosphere outside of the film forming apparatus. More specifically, the temperature or time upon low-temperature hydrogen annealing is set higher or longer than that of the above-described embodiment. In such a case, the temperature is preferably about 300 to 400° C., while treating time is preferably about 30 seconds to 15 minutes.

Application of the present invention made by the present inventors to a manufacturing technique of a semiconductor device having a CMIS circuit, a field becoming a background of the present invention, was so far described, but the present invention is not limited thereto, but can be applied to a manufacturing method of various semiconductor devices such as semiconductor devices having a memory circuit such as DRAM (Dynamic Random Access Memory), SRAM (Static Random Access Memory), flash memory (EEPROM; Electric Erasable Programmable Read Only Memory and FRAM (Ferro electric Random Access Memory), semiconductor devices having a logic circuit such as microprocessor, and mixed type semiconductor devices having, on one semiconductor substrate, the above-described memory circuit and logic circuit. The present invention can be applied to at least a manufacturing method of a semiconductor device, semiconductor integrated circuit device, electronic circuit device, electronic device or micromachine having an inlaid copper interconnect structure.

Advantages available from the typical inventions, of the inventions disclosed by the present application, will next be described briefly.

A dielectric breakdown strength between interconnects, each having a main conductor film composed of copper, can be improved by keeping a portion of the main conductor film on which an electric field concentration occurs apart from the polished surface of the surrounding insulating film.

What is claimed is:

1. A method for manufacturing a semiconductor device, comprising the steps of:
   (a) depositing a first insulating film on a wafer;
   (b) forming an interconnect opening in said first insulating film;
   (c) forming, in said interconnect opening, an interconnect having a conductor film comprised mainly of copper;
   (d) forming a taper at a corner of said conductor film on an opening side of said interconnect opening, in said conductor film comprised mainly of copper; and
   (e) depositing a second insulating film over said first insulating film and said interconnect.
   wherein said taper is a round taper formed by heat treating said wafer in an atmosphere of a nitrogen gas, an ammonia gas or a nitrogen-ammonia gas mixture, or in a plasma atmosphere using the gas.

2. A method according to claim 1, wherein said step (a) includes the steps of:
   (a1) depositing a relatively thick insulating film, and
   (a2) after said step (a1), depositing thereover a relatively thin insulating film having a higher dielectric constant than said relatively thick insulating film.

3. A method according to claim 2, wherein a dielectric constant of said relatively thick insulating film is lower than that of a silicon dioxide film.

4. A method according to claim 2, wherein said relatively thin insulating film is made of silicon carbide, silicon carbonitride or silicon oxynitride.

5. A method according to claim 1, wherein said first insulating film is a single-substance insulating film having a dielectric constant lower than that of a silicon dioxide film.

6. A method according to claim 1, wherein said second insulating film is made of silicon carbide, silicon carbonitride or silicon oxynitride.

7. A method for manufacturing a semiconductor device, comprising the steps of:
   (a) depositing a first insulating film on a wafer;
   (b) forming an interconnect opening in said first insulating film;
   (c) forming, in said interconnect opening, an interconnect having a conductor film comprised mainly of copper;
   (d) forming a taper at a corner of said conductor film on an opening side of said interconnect opening, in said conductor film comprised mainly of copper; and
   (e) depositing a second insulating film over said first insulating film and said interconnect,
   the method further comprising, between the step (c) and (e) subjecting said first insulating film and said interconnect to reducing plasma treatment.

8. A method according to claim 7, wherein the reducing plasma treatment is ammonia plasma treatment hydrogen plasma treatment, or treatment using both thereof in combination.

9. A method according to claim 7, wherein said step (a) includes the steps of:
   (a1) depositing a relatively thick insulating film, and
   (a2) after said step (a1) depositing thereover a relatively thin insulating film having a higher dielectric constant than said relatively thick insulating film.

10. A method according to claim 9, wherein a dielectric constant of said relatively thick insulating film is lower than of a silicon dioxide film.

11. A method according to claim 9, wherein said relatively thin insulating film is made of silicon carbide, silicon carbinitride or silicon oxynitrade.

12. A method according to claim 7, wherein said first insulating film is a single-substance insulating film having a dielectric constant lower than that of a silicon dioxide film.

13. A method according to claim 7, wherein said second insulating film is made of silicon carbide, silicon carbonitride or silicon oxynitride.

14. A method for manufacturing a semiconductor device, comprising the step of:
   (a) depositing a first insulating film over a wafer;
   (b) forming an interconnect opening in said first insulating film;
   (c) forming, in said interconnect opening, an interconnect including a first conductor film having barrier properties against copper diffusion and a second conductor film comprised mainly of copper;
   (d) forming a taper at a corner of said second conductor film on an opening side of said interconnect opening; and
   (e) depositing a second insulating film over said first insulating film and said interconnect,
   wherein said taper is a round taper formed by heat treating said wafer in an atmosphere of a nitrogen gas, an ammonia gas or a nitrogen-ammonia gas mixture, or in a plasma atmosphere using the gas.

15. A method according to claim 14, wherein said step (a) comprises the steps of:
- (a1) depositing a relatively thick insulating film; and
- (a2) after said step (a1), depositing thereover a relatively thin insulating film having a dielectric constant higher than that of said relatively thick insulating film.

16. A method according to claim 15, wherein said relatively thick insulating film has a dielectric constant lower than that of a silicon dioxide film.

17. A method according to claim 15, wherein said relatively thin insulating film is made silicon carbide, silicon carbonitride or silicon oxynitride.

18. A method according to claim 14, wherein said first insulating film is a single-substance insulating film having a dielectric constant lower than that of a silicon dioxide film.

19. A method according to claim 18, wherein said step (c) comprises the step of:
- (c1) depositing said first conductor film over said first insulating film and in said interconnect opening;
- (c2) depositing said second conductor film over said first conductor film;
- (c3) selectively polishing said second conductor film to leave said first and second conductor films in said interconnect opening; and
- (c4) selecting polishing said first conductor film to leave said first and second conductor films in said interconnect opening, thereby forming said interconnect.

20. A method according to claim 19, wherein the amount of and abrasive used in said polishing step (c3) is 0 or smaller than that used in said polishing step (c4).

21. A method according to claim 14, wherein said second insulating film is made of silicon carbide, silicon carbonitride or silicon oxynitride.

22. A method according to claim 14, wherein said second insulating film is a laminate film obtained by depositing a third insulating film over said first insulating film and said interconnect to protect said first conductor film from oxidation, and depositing over said third insulating film a fourth insulating film by chemical vapor deposition using an oxygen-containing gas.

23. A method according to claim 22, wherein said third insulating film is made of silicon nitride.

24. A method according to claim 22, wherein said third insulating film is made if silicon carbide or silicon carbonitride.

25. A method according to claim 22, wherein said fourth insulating film is made of silicon oxynitride by chemical vapor deposition using a gas mixture containing trimethoxysilane and nitrogen oxide.

26. A method according to claim 22, wherein said third insulating film is thinner than said fourth insulating film.

27. A method for manufacturing a semiconductor device, comprising the steps of:
- (a) depositing a first insulating film on a wafer;
- (b) forming an interconnect opening in said first insulating film;
- (c) forming, in said interconnect opening, an interconnect including a first conductor film having barrier properties against copper diffusion and a second conductor film comprised mainly of copper;
- (d) forming a taper at a corner of said second conductor film on an opening side of said interconnect opening; and
- (e) depositing a second insulating film over said first insulating film and said interconnect, the method further comprising, between the step (c) and (e) subjecting said first insulating film and said interconnect to reducing plasma treatment.

28. A method according to claim 27, wherein the reducting plasma treatment is ammonia plasma treatment, hydrogen plasma treatment, or treatment using both thereof in combination.

29. A method according to claim 27, wherein said step (a) includes the steps of:
- (a1) depositing a relatively thick insulating film, and
- (a2) after said step (a1), depositing thereover a relatively thin insulating film having a higher dielectric constant than said relatively thick insulating film.

30. A method according to claim 29, wherein said relatively thick insulating film has a dielectric constant lower than that of a silicon dioxide film.

31. A method according to claim 29, wherein said relatively thin insulating film is made of silicon carbide, silicon carbonitride or silicon oxynitride.

32. A method according to claim 27, wherein said first insulating film is a single-substance insulating film having a dielectric constant lower than that of a silicon dioxide film.

33. A method according to claim 32, wherein said step (c) comprises the steps of:
- (c1) depositing said first conductor film over said first insulating film and in said interconnect opening;
- (c2) depositing said second conductor film over said first conductor film;
- (c3) selectively polishing said second conductor film to leave said first and second conductor films in said interconnect opening; and
- (c4) selectively polishing said first conductor film to leave said first and second conductor films in said interconnect opening, thereby forming said interconnect.

34. A method according to claim 33, wherein the amount of an abrasive used in said polishing step (c3) is 0 or smaller than that used in said polishing step (c4).

35. A method according to claim 27, wherein said second insulating film is made of silicon carbide, silicon carbonitride or silicon oxynitride.

36. A method according to claim 27, wherein said second insulating film is a laminate film obtained by depositing a third insulating film over said first insulating film and said interconnect to protect said first conductor film from oxidation, and depositing over said third insulating film a fourth insulating film by chemical vapor deposition using an oxygen-containing gas.

37. A method according to claim 36, wherein said third insulating film is made of made of silicon nitride.

38. A method according to claim 36, wherein said third insulating film is made of silicon carbide or silicon carbonitride.

39. A method according to claim 36, wherein said fourth insulating film is made of silicon oxynitride by chemical vapor deposition using a gas mixture containing trimethoxysilane and nitrogen oxide.

40. A method according to claim 36, wherein said third insulating film is thinner than said fourth insulating film.

* * * * *